(12) United States Patent
Izumi

(10) Patent No.: US 9,978,860 B2
(45) Date of Patent: May 22, 2018

(54) SEMICONDUCTOR DEVICE AND METHOD OF MANUFACTURING SEMICONDUCTOR DEVICE

(71) Applicant: ROHM CO., LTD., Kyoto OT (JP)

(72) Inventor: Naoki Izumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

(21) Appl. No.: 15/223,037

(22) Filed: Jul. 29, 2016

(65) Prior Publication Data

US 2016/0380096 A1    Dec. 29, 2016

Related U.S. Application Data

(60) Continuation of application No. 13/371,501, filed on Feb. 13, 2012, now Pat. No. 9,406,794, which is a division of application No. 12/230,620, filed on Sep. 2, 2008, now Pat. No. 8,129,779.

(30) Foreign Application Priority Data

Sep. 3, 2007   (JP) ................................. 2007-228033
Sep. 20, 2007  (JP) ................................. 2007-244410
Aug. 28, 2008  (JP) ................................. 2008-220163

(51) Int. Cl.
*H01L 29/417*   (2006.01)
*H01L 29/423*   (2006.01)
*H01L 29/66*    (2006.01)
*H01L 29/78*    (2006.01)

(52) U.S. Cl.
CPC ...... *H01L 29/7813* (2013.01); *H01L 29/4236* (2013.01); *H01L 29/42368* (2013.01); *H01L 29/66734* (2013.01); *H01L 29/41775* (2013.01)

(58) Field of Classification Search
CPC .................................................. H01L 29/42368
See application file for complete search history.

(56) References Cited

U.S. PATENT DOCUMENTS 6,228,750 B1    5/2001  Shibib
2001/0008291 A1 7/2001  Aoki et al.
2002/0167046 A1 11/2002 Aoki et al.
(Continued)

FOREIGN PATENT DOCUMENTS

JP    11-274484      10/1999
JP    11274484 A  *  10/1999
(Continued)

*Primary Examiner* — Raj R Gupta
(74) *Attorney, Agent, or Firm* — Rabin & Berdo, P.C.

(57) ABSTRACT

A semiconductor device includes a semiconductor layer. A first conductivity type region is formed on a base layer portion of the semiconductor layer. A body region of a second conductivity type is formed on the semiconductor layer to be in contact with the first conductivity type region. A trench in which a gate electrode is embedded through a gate insulating film is formed on the semiconductor layer. The trench penetrates through the body region, so that a deepest portion thereof reaches the first conductivity type region. A source region of the first conductivity type is formed on a surface layer portion of the semiconductor layer around the trench. The gate insulating film includes a thick-film portion having a relatively large thickness on a bottom surface of the trench.

4 Claims, 22 Drawing Sheets

(56) References Cited

U.S. PATENT DOCUMENTS

| | | |
|---|---|---|
| 2004/0203200 A1 | 10/2004 | Williams et al. |
| 2005/0017294 A1* | 1/2005 | Takemori ............ H01L 29/7813 |
| | | 257/330 |
| 2005/0090060 A1 | 4/2005 | Aoki et al. |
| 2005/0236664 A1 | 10/2005 | Aoki et al. |
| 2006/0141739 A1* | 6/2006 | Poelzl .................. H01L 29/407 |
| | | 438/424 |
| 2007/0057301 A1 | 3/2007 | Wang et al. |
| 2007/0090452 A1* | 4/2007 | Cho ................ H01L 21/823412 |
| | | 257/330 |
| 2007/0290260 A1 | 12/2007 | Adan |
| 2009/0078995 A1 | 3/2009 | Nakagawa et al. |

FOREIGN PATENT DOCUMENTS

| | | |
|---|---|---|
| JP | 2001-007326 | 1/2001 |
| JP | 2003-8018 | 1/2003 |
| JP | 2005-019668 A | 1/2005 |
| JP | 2005-333112 A | 12/2005 |
| JP | 2006-157016 A | 6/2006 |
| JP | 2006-344760 A | 12/2006 |
| JP | 2009-094484 A | 4/2009 |

* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation of application Ser. No. 13/371,501, filed on Feb. 13, 2012, which is a divisional of application Ser. No. 12/230,620, filed on Sep. 2, 2008 (now U.S. Pat. No. 8,129,779, issued on Mar. 6, 2012). Furthermore, this application claims the benefit of priority of Japanese applications 2007-228033 filed on Sep. 3, 2007, 2007-244410 filed on Sep. 20, 2007, and 2008-220163 filed on Aug. 28, 2008. The disclosures of these prior U.S. and Japanese applications are incorporated herein by reference.

BACKGROUND OF THE INVENTION

Field of the Invention

The present invention relates to a semiconductor device having a trench gate type VDMOSFET and a method of manufacturing the same.

Description of Related Art

A trench gate structure is generally known as a structure effective for refinement of a VDMOSFET (Vertical Double diffused Metal Oxide Semiconductor Field-Effect Transistor).

FIG. 7 is a schematic sectional view showing the structure of a conventional semiconductor device having a trench gate type VDMOSFET.

The semiconductor device 100 includes an N$^+$-type substrate 101. An N$^-$-type epitaxial layer 102 is laminated on the N$^+$-type substrate 101. A base layer portion of the N$^-$-type epitaxial layer 102 forms an N$^-$-type region 103, while a P-type body region 104 is formed on a surface layer portion of the N$^-$-type epitaxial layer 102 vertically adjacently to the N$^-$-type region 103.

A trench 105 is dug in the N$^-$-type epitaxial layer 102 from a surface thereof. The trench 105 penetrates through the P-type body region 104, so that a deepest portion thereof reaches the N$^-$-type region 103. A gate electrode 107 made of polysilicon doped with an N-type impurity in a high concentration is embedded in the trench 105 through a gate insulating film 106 made of SiO$_2$ (silicon oxide).

An N$^+$-type source region 108 is formed on a surface layer portion of the P-type body region 104 along the trench 105. A P$^+$-type contact region 109 is formed at the center of the N$^+$-type source region 108 in plan view, to penetrate through the N$^+$-type source region 108.

An interlayer dielectric film 110 is laminated on the N$^-$-type epitaxial layer 102. A source wire 111 is formed on the interlayer dielectric film 110. This source wire 111 is grounded. The source wire 111 is in contact (electrically connected) with the N$^+$-type source region 108 and the P$^+$-type contact region 109 through a contact hole 112 formed in the interlayer dielectric film 110. A gate wire 113 is electrically connected to the gate electrode 107 through another contact hole (not shown) formed in the interlayer dielectric film 110.

A drain electrode 114 is formed on a back surface of the N$^+$-type substrate 101.

When the potential of the gate electrode 107 is controlled while applying a positive voltage of a proper level to the drain electrode 114, a channel is formed in the vicinity of an interface between the P-type body region 104 and the gate insulating film 106, and a current flows between the N$^+$-type source region 108 and the drain electrode 114. Thus, a switching operation of the VDMOSFET is achieved.

For example, the product $R_{on} \cdot Q_g$ of the on-resistance $R_{on}$ and the gate charge quantity $Q_g$ is employed as an index indicating the switching performance of the VDMOSFET.

The on-resistance $R_{on}$ is the resistance between a source and a drain. In the semiconductor device 100 shown in FIG. 7, the on-resistance $R_{on}$ corresponds to the resistance between the N$^+$-type source region 108 and the N$^+$-type substrate 101 (between the source wire 111 and the drain electrode 114).

The gate charge quantity $Q_g$ corresponds to the quantity of charges stored in a combined capacitance of the gate-to-drain capacitance $C_{gd}$ and a gate-to-source capacitance $C_{gs}$. In the semiconductor device 100 shown in FIG. 7, the gate-to-drain capacitance $C_{gd}$ corresponds to a combined capacitance of the capacitance of a portion of the gate insulating film 106 sandwiched between the gate electrode 107 and the bottom surface of the trench 105 and the capacitance of a depletion layer 115 spreading from the interface between the N$^-$-type region 103 and the P-type body region 104. In the semiconductor device 100 shown in FIG. 7, a gate-to-source capacitance $C_{gs}$ corresponds to the capacitance of a portion of the gate insulating film 106 sandwiched between the gate electrode 107 and the N$^+$-type source region 108.

The speed of the switching operation can be increased as the product $R_{on} \cdot Q_g$ of the on-resistance $R_{on}$ and the gate charge quantity $Q_g$ is reduced. As shown in FIG. 8, however, the on-resistance $R_{on}$ and the gate charge quantity $Q_g$ are in the so-called trade-off relation, such that the former is increased when the latter is reduced and vice versa. In order to reduce the product $R_{on} \cdot Q_g$, therefore, one of the on-resistance $R_{on}$ and the gate charge quantity $Q_g$ must be reduced, while increase of the other must be prevented.

FIG. 9 is a schematic sectional view showing the structure of another conventional semiconductor device having a trench gate type VDMOSFET.

The semiconductor device 401 includes an N$^+$-type substrate 402. An N$^-$-type epitaxial layer 403 is laminated on the N$^+$-type substrate 402. A base layer portion of the N$^-$-type epitaxial layer 403 forms an N$^-$-type region 404, while a P-type body region 405 is formed on a surface layer portion of the N$^-$-type epitaxial layer 403 vertically adjacently to the N$^-$-type region 404.

A trench 406 is dug in the N$^-$-type epitaxial layer 403 from a surface thereof. The trench 406 penetrates through the P-type body region 405, so that a deepest portion thereof reaches the N$^-$-type region 404. A gate electrode 408 made of polysilicon (doped polysilicon) doped with an N-type impurity in a high concentration is embedded in the trench 406 through a gate insulating film 407.

An N$^+$-type source region 409 is formed on a surface layer portion of the P-type body region 405 along the trench 406. A P$^+$-type source contact region 410 is formed on the N$^+$-type source region 409, to penetrate through the N$^+$-type source region 409.

A drain electrode 415 is formed on a back surface of the N$^+$-type substrate 402.

When the potential of the gate electrode 408 is controlled while grounding the N$^+$-type source region 409 and applying a positive voltage of a proper level to the drain electrode 415, a channel is formed in the vicinity of an interface between the P-type body region 405 and the gate insulating film 407, and a current flows between the N$^+$-type source region 409 and the drain electrode 415.

In the steps of manufacturing the semiconductor device 401, a silicon oxide film is formed on the surface of the N⁻-type epitaxial layer 403 including the inner surface of the trench 406. Then, the gate electrode 408 made of doped polysilicon is formed on the silicon oxide film in the trench 406. Thereafter HF (hydrofluoric acid) is supplied to the surface of the portion of the silicon oxide film located outside the trench 406 to remove this portion of the silicon oxide film, in advance of ion implantation for forming the N⁺-type source region 409.

At this time, the upper portion of the silicon oxide film in the trench 406, i.e., the upper end portion of the gate insulating film 407 is also removed with HF, to result in a portion where the gate electrode 408 and the N⁺-type source region 409 are opposed to each other without through the gate insulating film 407, as shown in FIG. 9. In the ion implantation for forming the N⁺-type source region 409, impurity ions may be implanted into not only the N⁻-type epitaxial layer 403 but also the gate insulating film 407, to denature the film quality of the portion into which the impurity is implanted. Thus, the conventional semiconductor device 401 disadvantageously has a low withstand voltage (gate-to-source withstand voltage) between the gate electrode 408 and the N⁺-type source region 409.

SUMMARY OF THE INVENTION

A first object of the present invention is to provide a semiconductor device capable of reducing the gate charge quantity $Q_g$ without increasing the on-resistance $R_{on}$ and a method of manufacturing the same.

A second object of the present invention is to provide a semiconductor device capable of improving the gate-to-source withstand voltage.

A semiconductor device according to one aspect of the present invention includes: a semiconductor layer; a first conductivity type region of a first conductivity type formed on a base layer portion of the semiconductor layer; a body region of a second conductivity type formed on the semiconductor layer to be in contact with the first conductivity type region; a trench formed on the semiconductor layer to penetrate through the body region so that a deepest portion thereof reaches the first conductivity type region; a source region of the first conductivity type formed on a surface layer portion of the semiconductor layer around the trench to be in contact with the body region; a gate insulating film formed on a bottom surface and a side surface of the trench; and a gate electrode embedded in the trench through the gate insulating film. The gate insulating film includes a thick-film portion having a relatively large thickness (thickness in the depth direction of the trench) on the bottom surface of the trench.

According to this structure, the first conductivity type region is formed on the base layer portion of the semiconductor layer. The body region of the second conductivity type is formed on the semiconductor layer to be in contact with the first conductivity type region. Further, the trench in which the gate electrode is embedded through the gate insulating film is formed on the semiconductor layer. The trench penetrates through the body region, so that the deepest portion thereof reaches the first conductivity type region. The source region of the first conductivity type is formed on the surface layer portion of the semiconductor layer around the trench. The gate insulating film includes the thick-film portion having the relatively large thickness on the bottom surface of the trench.

In a trench gate type transistor, a channel is formed on a region (channel forming region) in the vicinity of the interface between a body region and a gate insulating film.

For example, the capacitance between a gate electrode and the bottom surface of a trench may be reduced by uniformly increasing the thickness of the gate insulating film thereby increasing an interval between the gate electrode and the bottom surface of the gate electrode. If the thickness of a portion of the gate insulating film opposed to the channel forming region is increased, however, not only the gate threshold voltage is increased but also the current capacity is reduced, and hence the channel resistance is increased. Consequently, the on-resistance $R_{on}$ is increased.

When the gate insulating film has the thick-film portion on the bottom surface of the trench, however, the interval between the gate electrode and the bottom of the trench opposed to each other through the thick-film portion can be increased while setting the thickness of the gate insulating film on the side surface of the trench to a proper value in consideration of the gate threshold voltage and the channel resistance. Thus, the capacitance between the gate electrode and the bottom surface (first conductivity type region) of the trench can be reduced without increasing the gate threshold voltage and the on-resistance $R_{on}$. Therefore, the gate-to-drain capacitance $C_{gd}$ can be reduced without increasing the on-resistance $R_{on}$, and the gate charge quantity $Q_g$ can also be reduced. Consequently, the speed of the switching operation of the transistor can be increased.

Preferably, the gate insulating film includes the thick-film portion on a peripheral edge portion of the bottom surface of the trench, and includes a thin-film portion having a relatively small thickness on a central portion surrounded by the peripheral edge portion. In other words, the gate insulating film is preferably relatively thickly formed on the peripheral edge portion of the bottom surface of the trench, and relatively thinly formed on the central portion surrounded by the peripheral edge portion.

The gate insulating film is so thickly formed on the peripheral edge portion of the bottom surface of the trench that the interval between the gate electrode and the bottom surface of the trench can be increased on the peripheral edge portion, and the capacitance therebetween can be reduced. Further, the thickness of the thin-film portion is so set that the upper surface of the thin-film portion is positioned to be flush with or lower than the interface between the first conductivity type region and the body region, whereby the gate electrode can be opposed to the channel forming region along the overall length (total channel length) thereof. Consequently, an excellent operation of the transistor can be ensured.

Thus, the excellent operation of the transistor can be ensured while reducing the gate-to-drain capacitance $C_{gd}$.

The semiconductor device having this structure can be obtained by a method including the steps of: forming a trench on a semiconductor layer of a first conductivity type; forming an oxide film material deposition layer by depositing an oxide film material on the semiconductor layer; partially leaving the oxide film material deposition layer on a peripheral edge portion of a bottom surface of the trench by etching back the oxide film material deposition layer; forming an oxide film by oxidizing a surface of the semiconductor layer including the bottom surface and a side surface of the trench and the oxide film material deposition layer left on the peripheral edge portion of the bottom surface of the trench; forming a gate electrode on the oxide film to fill up the trench; forming a body region of a second conductivity type by introducing an impurity of the second conductivity type from the surface of the semiconductor layer; forming a source region of the first conductivity type to be in contact with the body region by introducing an impurity of the first conductivity type into the periphery of the trench from the surface of the semiconductor layer; and forming a gate insulating film on the bottom surface and the side surface of the trench by removing a portion of the oxide film located outside the trench.

According to this method, the oxide film material deposition layer is partially left on the peripheral edge portion of the bottom surface of the trench. The left oxide film material deposition layer is oxidized simultaneously with the surface of the semiconductor layer including the bottom surface and the side surface of the trench. Due to this oxidation, the left oxide film material deposition layer forms a thick-film portion having a relatively large thickness. On the other hand, a portion formed by oxidizing the bottom surface of the trench forms a thin-film portion having a relatively small thickness. The thick-film portion and the thin-film portion form the thick-film portion and the thin-film portion of the gate insulating film respectively.

Thus, the thick-film portion and the thin-film portion of the gate insulating film can be simultaneously formed. Therefore, the gate insulating film including the thick-film portion and the thin-film portion can be easily formed without through complicated steps.

The gate insulating film may have a uniform thickness on the side surface of the trench.

In this case, the thickness of the thick-film portion is preferably larger than the thickness of the gate insulating film on the side surface of the trench.

The on-resistance $R_{on}$ can be reduced by relatively reducing the thickness of the gate insulating film on the side surface of the trench, while the gate-to-drain capacitance $C_{gd}$ can be reduced by relatively increasing the thickness of the thick-film portion.

The gate insulating film may be so formed that the thickness of a portion in contact with the source region is larger than the thickness of a portion in contact with the body region on the side surface of the trench.

The capacitance between the gate electrode and the source region, i.e., the gate-to-source capacitance $C_{gs}$ can be reduced by increasing the thickness of the portion of the gate insulating film in contact with the source region while setting the thickness of the portion of the gate insulating film in contact with the body region to a proper value in consideration of the gate threshold voltage and the channel resistance. Thus, the gate-to-source capacitance $C_{gs}$ can be reduced without increasing the on-resistance $R_{on}$, and the gate charge quantity $Q_g$ can also be reduced. Consequently, the speed of the switching operation of the transistor can be further increased.

The thickness of the portion of the gate insulating film in contact with the source region is so increased that a large interval can be ensured between the gate electrode and the source region. Consequently, the gate-to-source withstand voltage can be improved.

In this case, the thickness of the thick-film portion is preferably larger than the thickness of the portion in contact with the body region.

The on-resistance $R_{on}$ can be reduced by relatively reducing the thickness of the portion of the gate insulating film in contact with the body region, while the gate-to-drain capacitance $C_{gd}$ can be reduced by relatively increasing the thickness of the thick-film portion.

A semiconductor device according to another aspect of the present invention includes: a semiconductor layer; a first conductivity type region of a first conductivity type formed on a base layer portion of the semiconductor layer; a body region of a second conductivity type formed on the semiconductor layer to be in contact with the first conductivity type region; a trench formed on the semiconductor layer to penetrate through the body region so that a deepest portion thereof reaches the first conductivity type region; a source region of the first conductivity type formed on a surface layer portion of the semiconductor layer around the trench to be in contact with the body region; a gate insulating film formed on a bottom surface and a side surface of the trench; and a gate electrode embedded in the trench through the gate insulating film. The gate insulating film is so formed that the thickness of a portion in contact with the source region is larger than the thickness of a portion in contact with the body region on the side surface of the trench.

According to this structure, the first conductivity type region is formed on the base layer portion of the semiconductor layer. The body region of the second conductivity type is formed on the semiconductor layer to be in contact with the first conductivity type region. Further, the trench in which the gate electrode is embedded through the gate insulating film is formed on the semiconductor layer. The trench penetrates through the body region, so that the deepest portion thereof reaches the first conductivity type region. The source region of the first conductivity type is formed on the surface layer portion of the semiconductor layer around the trench. The gate insulating film is so formed that the thickness of the portion in contact with the source region is larger than the thickness of the portion in contact with the body region on the side surface of the trench. In other words, the portion of the gate insulating film adjacent to the source region has a larger thickness than the remaining portion of the gate insulating film.

The capacitance between the gate electrode and the source region, i.e., the gate-to-source capacitance $C_{gs}$ can be reduced by increasing the thickness of the portion of the gate insulating film in contact with the source region while setting the thickness of the portion of the gate insulating film in contact with the body region to a proper value in consideration of the gate threshold voltage and the channel resistance. Thus, the gate-to-source capacitance $C_{gs}$ can be reduced without increasing the on-resistance $R_{on}$, and the gate charge quantity $Q_g$ can also be reduced. Consequently, the speed of the switching operation of the transistor can be increased.

The thickness of the portion of the gate insulating film in contact with the source region is so increased that a large interval can be ensured between the gate electrode and the source region. Consequently, the gate-to-source withstand voltage can be improved.

Preferably, the gate insulating film extends from the side surface of the trench onto the surface of the source region.

Thus, the gate insulating film can be reliably interposed between the gate electrode and the source region. Consequently, the gate-to-source withstand voltage can be reliably improved.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
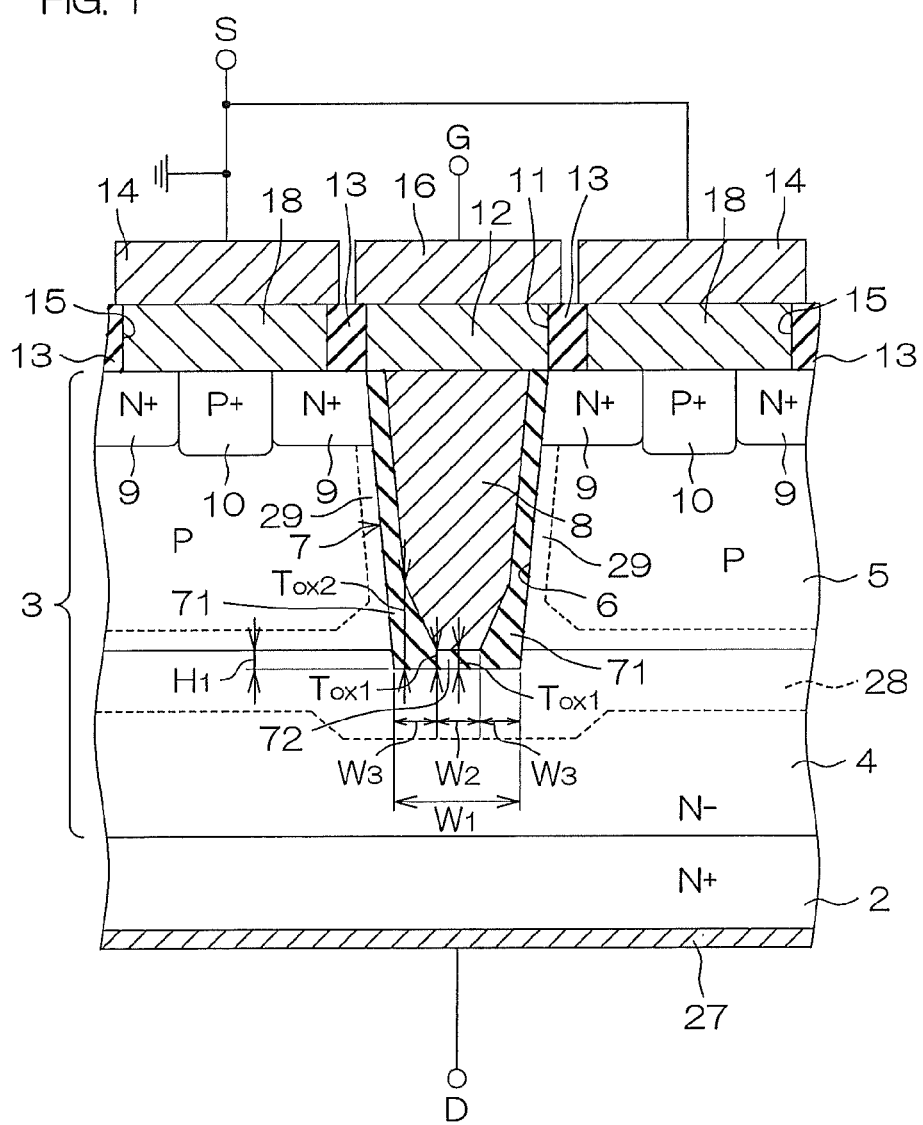
FIG. 1 is a schematic sectional view of a semiconductor device according to a first embodiment of the present invention.

FIG. 1 is a schematic sectional view of a semiconductor device according to a first embodiment of the present invention.

The semiconductor device 1 has an array structure formed by arranging unit cells having trench gate type VDMOSFET in a form of a matrix.

On an $N^+$-type substrate 2 forming a base of the semiconductor device 1, an $N^-$-type epitaxial layer 3 made of silicon doped with an N-type impurity in a lower concentration ($10^{15}/cm^3$, for example) than the $N^+$-type substrate 2 is laminated. A base layer portion of the epitaxial layer 3 forms an $N^-$-type region 4 as a first conductivity type region in a state after epitaxy. In the epitaxial layer 3, a P-type body region 5 is formed on the $N^-$-type region 4 to be in contact with the $N^-$-type region 4.

A trench 6 is dug in the epitaxial layer 3 from a surface thereof. The trench 6 penetrates through the body region 5, so that a deepest portion thereof reaches the $N^-$-type region 4. A plurality of such trenches 6 are formed at regular intervals in the horizontal direction in FIG. 1, to extend in a direction (along a gate width) perpendicular to the plane of FIG. 1 respectively. Each trench 6 has a width $W_1$ of 0.5 μm, for example, in the horizontal direction (orthogonal to the gate width) in FIG. 1. A gate insulating film 7 made of $SiO_2$ (silicon oxide) is formed in the trench 6, to cover an overall inner surface thereof.

The gate insulating film 7 includes a thick-film portion 71 having a relatively large thickness (thickness in a depth direction of the trench 6) and a thin-film portion 72 having a relatively small thickness on a bottom surface of the trench 6.

The thick-film portion 71 is formed on the peripheral edge portion of the bottom surface of the trench 6. The thick-film portion 71 has a sectional shape increased in thickness toward a side surface of the trench 6. The maximum thickness $T_{ox2}$ (150 nm, for example) of the thick-film portion 71 is larger than an interval $H_1$ (50 nm, for example) between the bottom surface of the trench 6 and an upper surface of the $N^-$-type region 4 (interface between the $N^-$-type region 4 and the body region 5). On the other hand, the minimum thickness $T_{ox1}$ (50 nm, for example) of the thick-film portion 71 is equal to the interval $H_1$. The thick film 71 is in contact with the bottom surface of the trench 6 with a width $W_3$ of 0.1 μm, for example.

The thin-film portion 72 is formed at a center of the bottom surface of the trench 6. An upper surface of the thin-film portion 72 is flush with the upper surface of the N⁻-type region 4. In other words, the thickness $T_{ox1}$ of the thin-film portion 72 is equal to the interval $H_1$ between the bottom surface of the trench 6 and the upper surface of the N⁻-type region 4. The thin-film portion 72 is in contact with the bottom surface of the trench 6 with a width $W_2$ of 0.3 µm, for example.

The gate electrode 8 is embedded in the trench 6 by filling up an inner side of the gate insulating film 7 in the trench 6 with polysilicon doped with an N-type impurity in a high concentration.

On the surface layer portion of the epitaxial layer 3, N⁺-type source regions 9 each having a higher N-type impurity concentration ($10^{19}/cm^3$, for example) than the N⁻-type region 4 are formed on both sides of the trench 6 in the direction (horizontal direction in FIG. 1) orthogonal to the gate width. Each source region 9 extends along the trench 6 in the direction along the gate width, so that a bottom portion thereof is in contact with the body region 5. A P⁺-type contact region 10 is formed at a center of the source region 9 in the direction orthogonal to the gate width, to penetrate through the source region 9.

That is, the trenches 6 and the source regions 9 are alternately provided in the direction orthogonal to the gate width, to extend in the direction along the gate width respectively. Boundaries between the unit cells adjacent to one another in the direction orthogonal to the gate width are set on the source regions 9, along the source regions 9. At least one or more contact regions 10 are provided over each pair of unit cells adjacent to each other in the direction orthogonal to the gate width. Boundaries between the unit cells adjacent to one another in the direction along the gate width are so set that the gate electrode 8 included in each unit cell has a constant gate width.

An interlayer dielectric film 13 is laminated on the epitaxial layer 3.

Source wires 14 and a gate wire 16 are formed on the interlayer dielectric film 13. The source wires 14 are grounded.

In the interlayer dielectric film 13, contact holes 15 are penetratingly formed on positions where the source wires 14 and the source regions 9 including the contact regions 10 are opposed to one another. Source plugs 18 are embedded in the contact hole 15. The source wires 14 are in contact (electrically connected) with the source regions 9 and the contact regions 10 through the source plugs 18.

In the interlayer dielectric film 13, further, a contact hole 11 is penetratingly formed on the position where the gate wire 16 and the gate electrode 8 are opposed to each other. A gate plug 12 is embedded in the contact hole 11. The gate wire 16 is in contact (electrically connected) with the gate electrode 8 through the gate plug 12.

A drain electrode 27 is formed on a back surface of the N⁺-type substrate 2.

When the potential of the gate electrode 8 is controlled while applying a positive voltage of a proper level to the drain electrode 27, channels are formed in the vicinity (channel forming regions 29) of the interface between the body region 5 and the gate insulating film 7, and current flows between the source regions 9 and the drain electrode 27.

In the semiconductor device 1, the thickness of the gate insulating film 7 is not uniformly increased, but the gate insulating film 7 is locally thickly formed on the peripheral edge portion of the bottom surface of the trench 6. Thus, the gate insulating film 7 includes the thick-film portion 71 having a larger thickness than the remaining portion on the peripheral edge portion of the bottom surface of the trench 6. Therefore, the interval between the gate electrode 8 and the bottom surface of the trench 6 opposed to each other through the thick-film portion 71 can be increased while properly setting the thickness of the gate insulating film 7 on the side surface of the trench 6 in consideration of the gate threshold voltage and the channel resistance. Thus, the capacitance $C_{ox1}$ between the gate electrode 8 and the bottom surface of the trench 6 (N⁻-type region 4) opposed to each other through the gate insulating film 7 can be reduced without increasing the gate threshold voltage and the on-resistance $R_{on}$. Therefore, the gate-to-drain capacitance $C_{gd}$ can be reduced without increasing the on-resistance $R_{on}$, and the gate charge quantity $Q_g$ can also be reduced. Consequently, the speed of the switching operation of the VDMOSFET can be increased.

Figure 7:
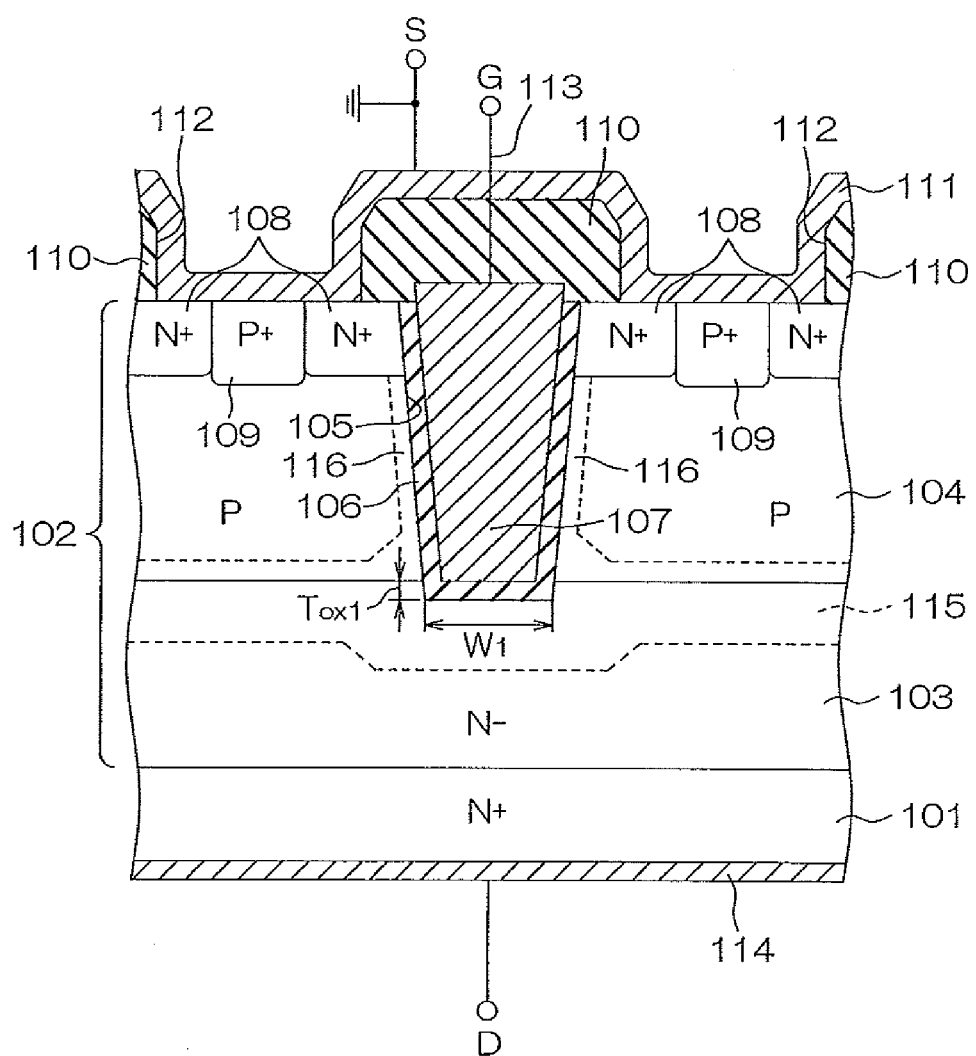
FIG. 7 is a schematic sectional view showing the structure of a conventional semiconductor device having a trench gate type VDMOSFET.
Figure 8:
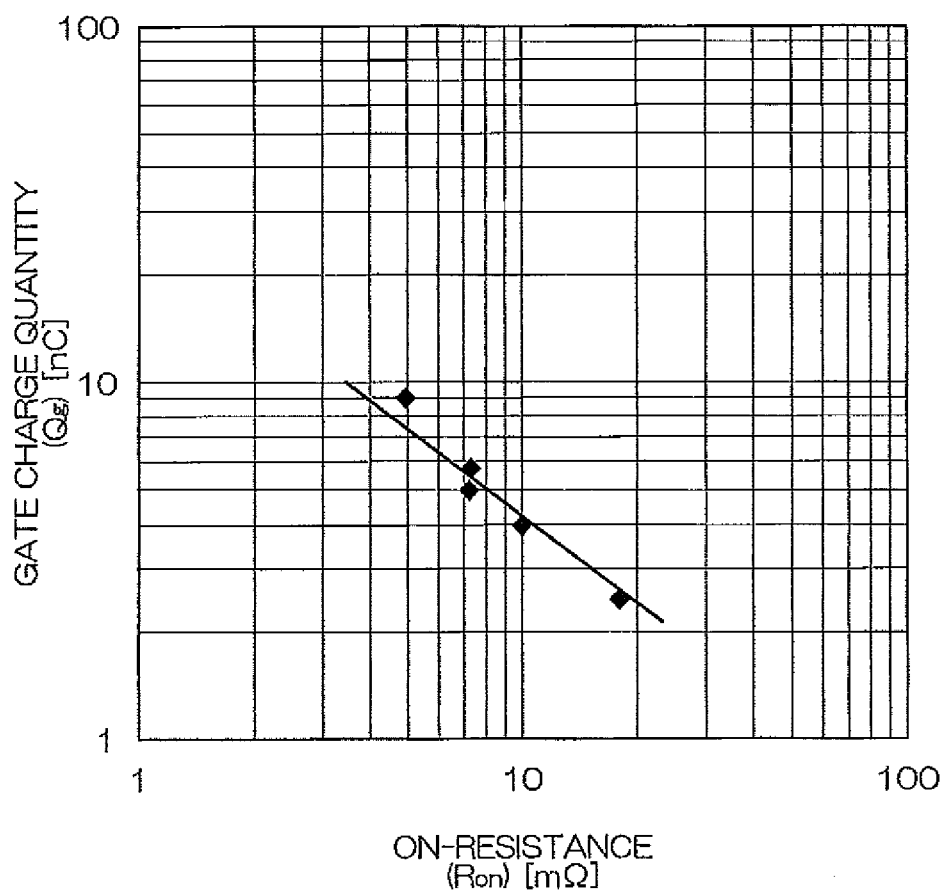
FIG. 8 is a graph showing the relation between the on-resistance $R_{on}$ and the gate charge quantity $Q_g$ of the VDMOSFET shown in FIG. 7.
Figure 9:
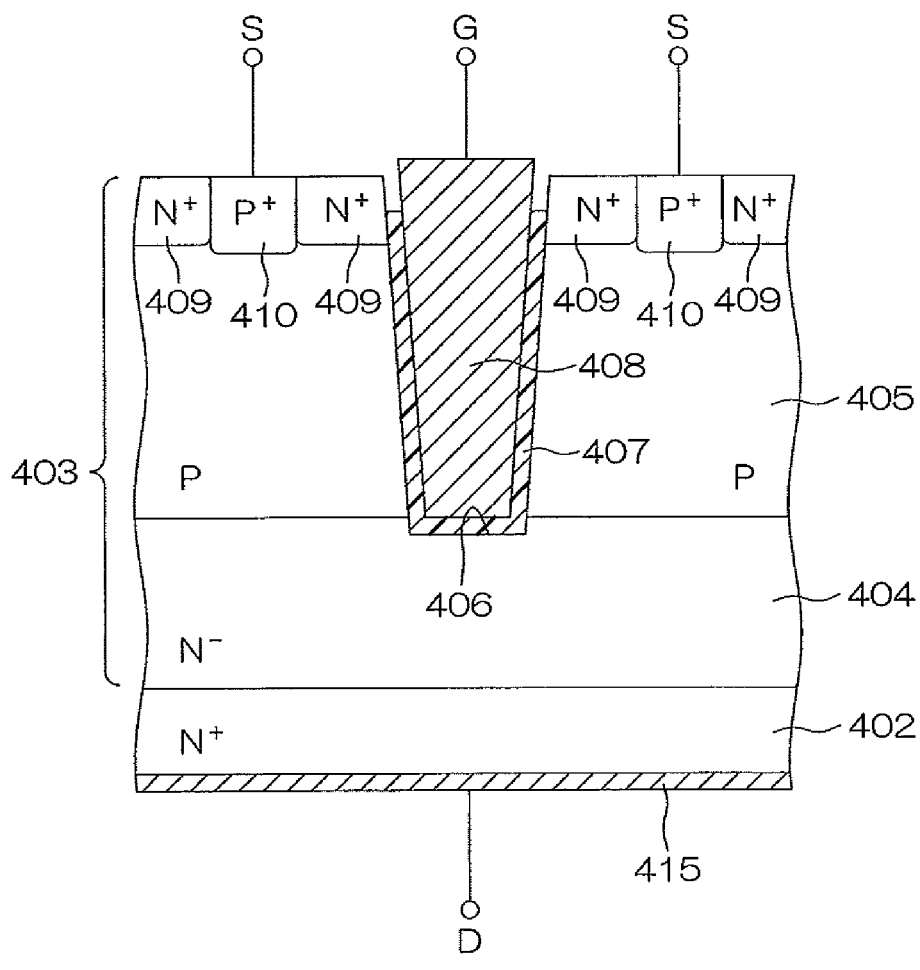
FIG. 9 is a schematic sectional view showing the structure of another conventional semiconductor device having a trench gate type VDMOSFET.

In the semiconductor device 100 shown in FIG. 7, it is assumed that the width of the trench 105 and the gate width are equal to the width $W_1$ of the trench 6 and the gate width $W_g$ respectively. It is also assumed that the thickness of the gate insulating film 106 is equal to the thickness $T_{ox1}$ of the thick-film portion 72 of the gate insulating film 7. In this case, the capacitance $C_{ox2}$ between the gate electrode 107 and the bottom surface of the trench 105 (N⁻-type region 103) opposed to each other through the gate insulating film 106 is expressed as follows:

$$C_{ox2} = \in_{ox} \cdot W_1 \cdot W_g / T_{ox1}$$

where $\in_{ox}$ represents the dielectric constant of $SiO_2$.

Assuming that $T_{ox(t)}$ represents the thickness of the thick-film portion 71 in the depth direction of the trench 6 in the semiconductor device 1, on the other hand, the capacitance $C_{ox1}$ between the gate electrode 8 and the bottom surface of the trench 6 (N⁻-type region 4) opposed to each other through the gate insulating film 7 is expressed as follows:

$$C_{ox1} = \in_{ox} \cdot W_2 \cdot W_g / T_{ox1} + 2 \int_0^{w3} \in_{ox} \cdot dt / T_{ox(t)}$$

It is assumed that $\int_0^{w3} \in_{ox} \cdot dt / T_{ox(t)} \approx W_3 / 2 \, T_{ox1}$. Substituting $W_1 = 0.5$ µm, $W_2 = 0.3$ µm, $W_3 = 0.1$ µm and $T_{ox1} = 50$ nm in the above expressions for obtaining the capacitances $C_{ox1}$ and $C_{ox2}$ and comparing $C_{ox1}$ and $C_{ox2}$ with each other, the relation therebetween is expressed as follows:

$$C_{ox1} = 0.8 C_{ox2}$$

Hence, it is understood that the capacitance $C_{ox1}$ in the structure of the semiconductor device 1 is reduced below the capacitance $C_{ox2}$ in the structure of the semiconductor device 100.

The gate insulating film 7 includes the thin-film portion 72 at the center of the bottom surface of the trench 6, and the upper surface of the thin-film portion 72 is flush with the upper surface of the N⁻-type region 4. Therefore, the gate electrode 8 can be opposed to the overall widths (total channel lengths) of the channel forming regions 29. Consequently, an excellent operation of the VDMOSFET can be ensured.

Thus, the excellent operation of the VDMOSFET can be ensured while reducing the gate-to-drain capacitance $C_{gd}$.

Figure 2A:
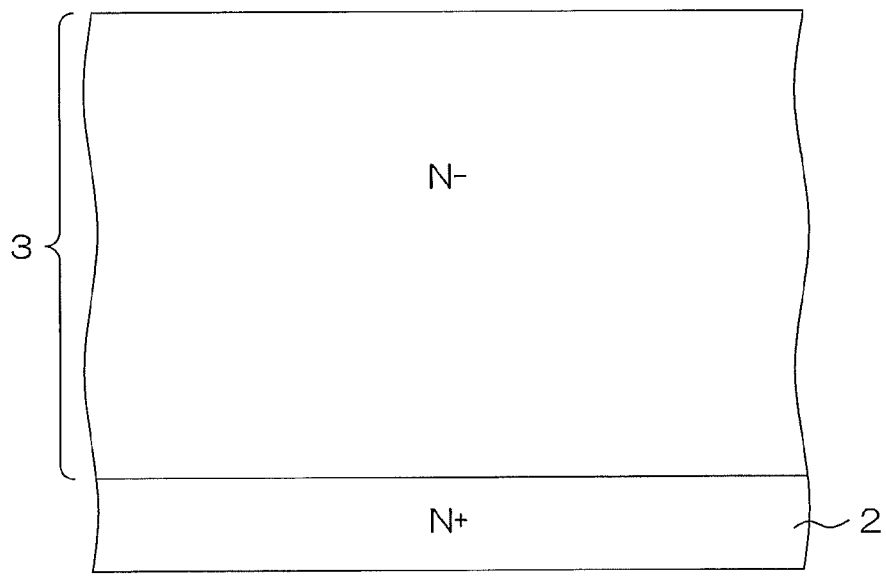
FIG. 2A is a schematic sectional view for describing a method of manufacturing the semiconductor device shown in FIG. 1.
Figure 2B:
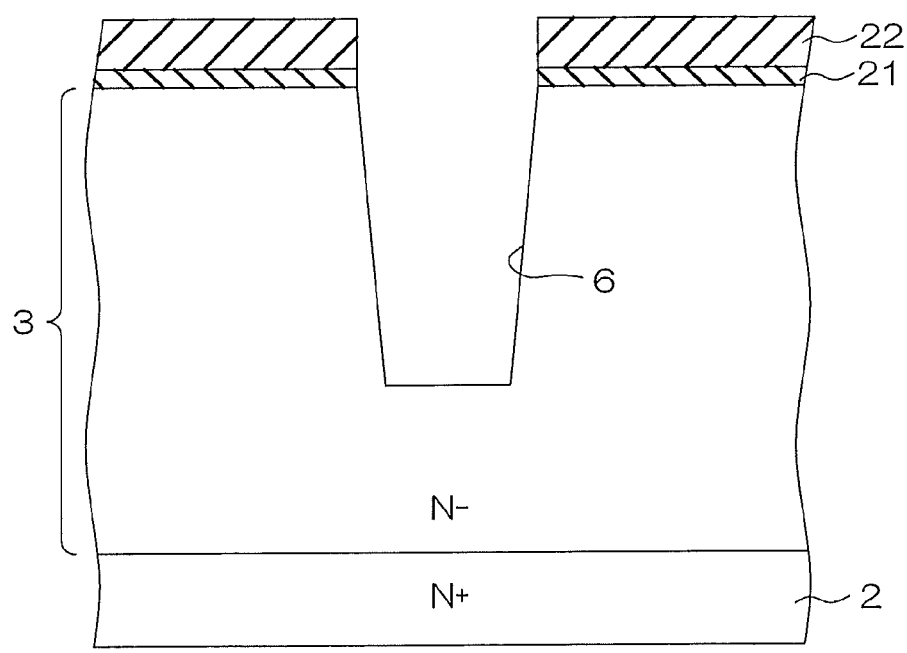
FIG. 2B is a schematic sectional view of a step subsequent to that of FIG. 2A.
Figure 2C:
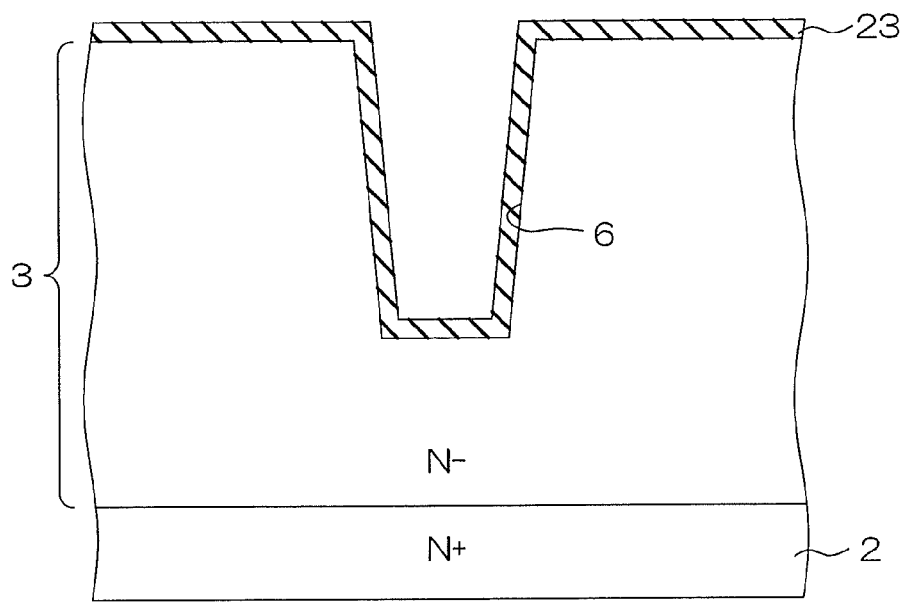
FIG. 2C is a schematic sectional view of a step subsequent to that of FIG. 2B.
Figure 2D:
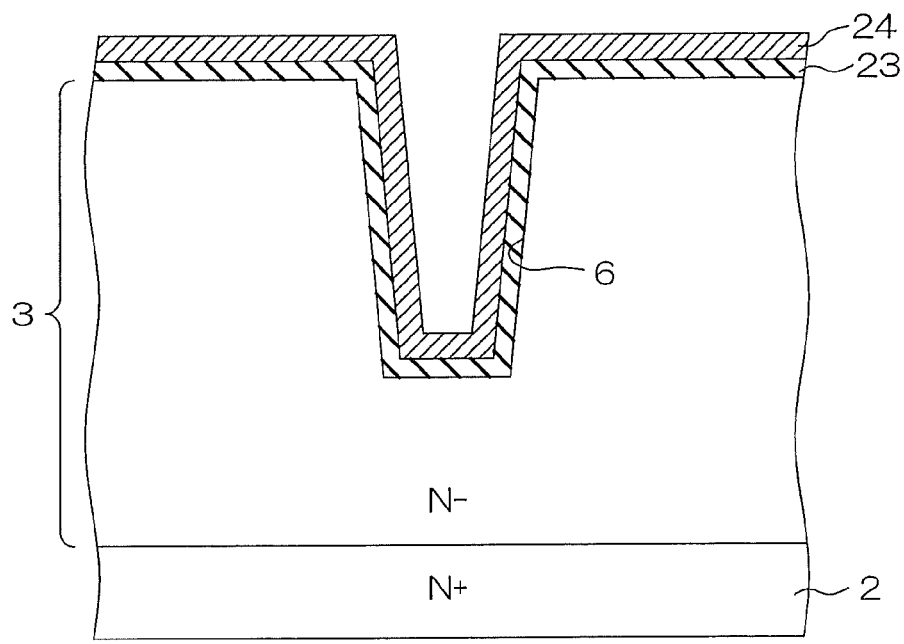
FIG. 2D is a schematic sectional view of a step subsequent to that of FIG. 2C.
Figure 2E:
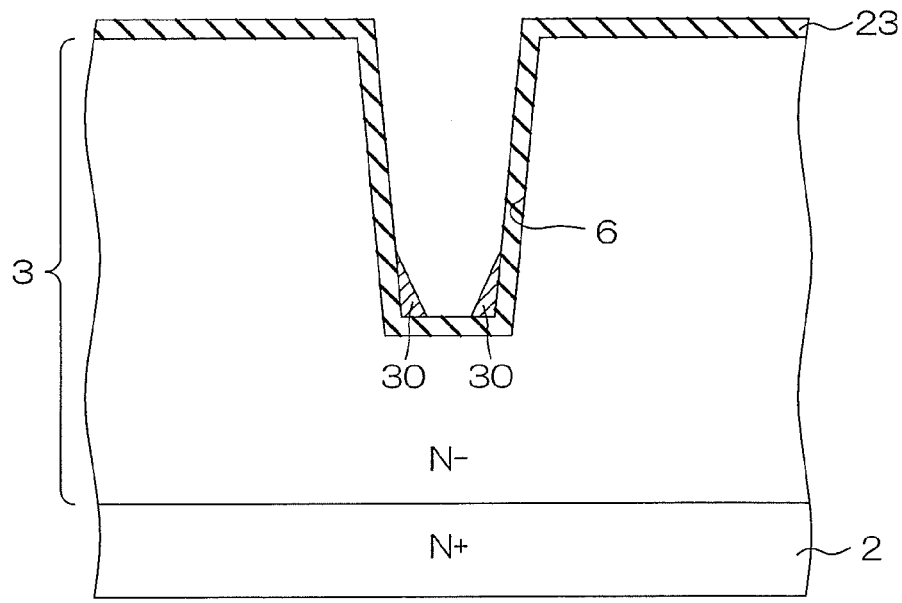
FIG. 2E is a schematic sectional view of a step subsequent to that of FIG. 2D.
Figure 2F:
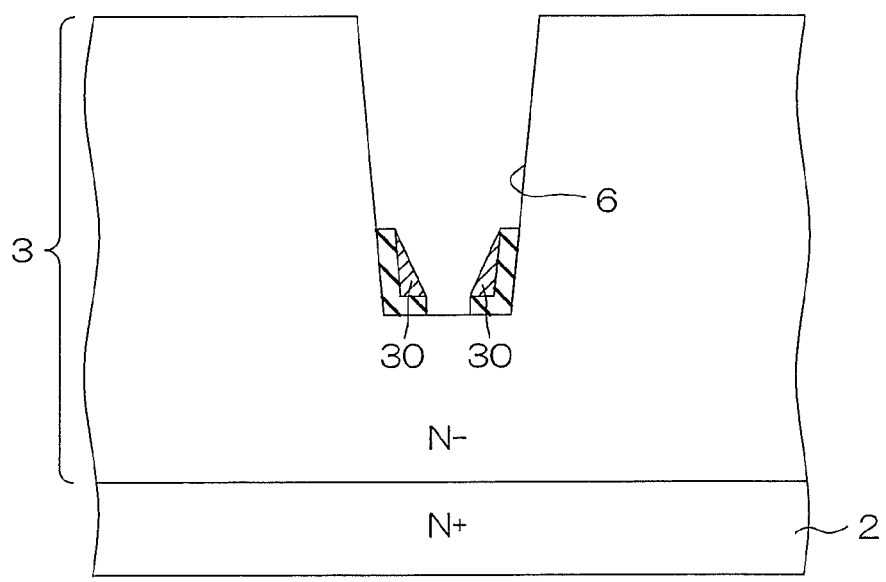
FIG. 2F is a schematic sectional view of a step subsequent to that of FIG. 2E.
Figure 2G:
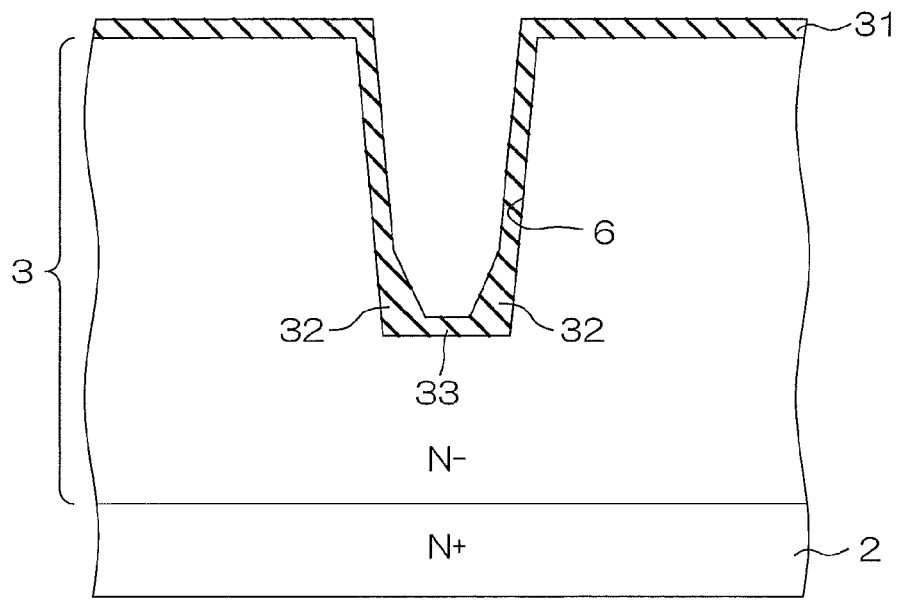
FIG. 2G is a schematic sectional view of a step subsequent to that of FIG. 2F.
Figure 2H:
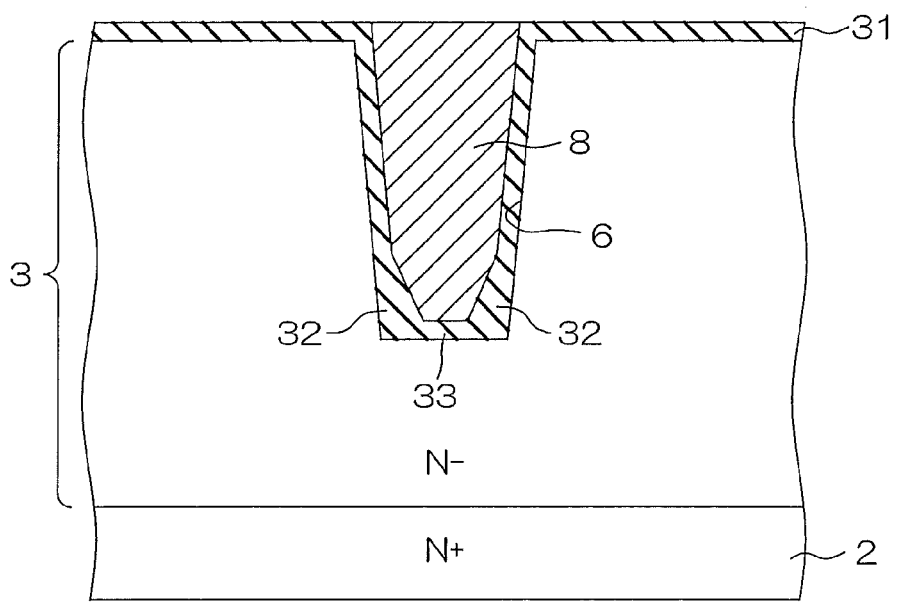
FIG. 2H is a schematic sectional view of a step subsequent to that of FIG. 2G.
Figure 2:
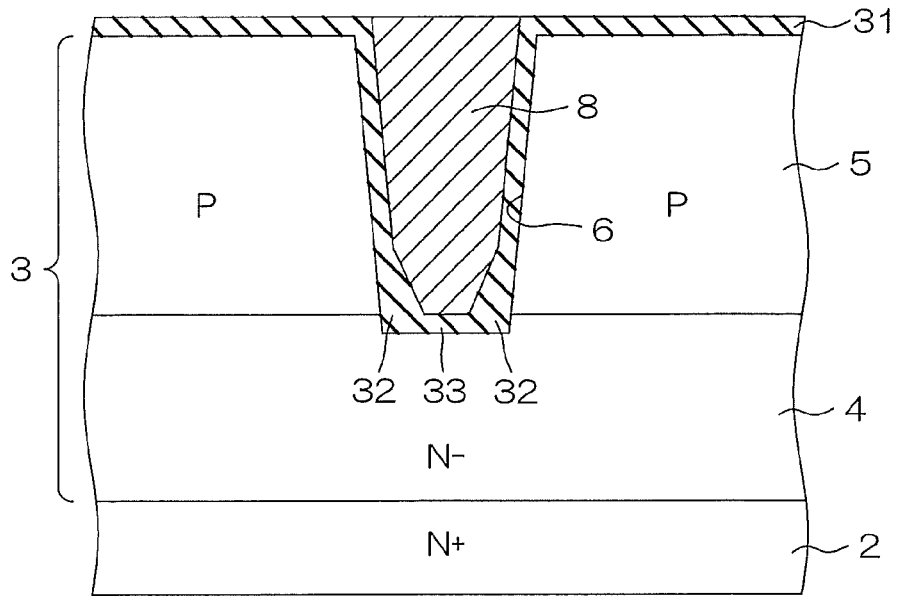
FIG. 2I is a schematic sectional view of a step subsequent to that of FIG. 2H.
FIG. 2J is a schematic sectional view of a step subsequent to that of FIG. 2I.
FIG. 2K is a schematic sectional view of a step subsequent to that of FIG. 2J.
FIG. 2L is a schematic sectional view of a step subsequent to that of FIG. 2K.
FIG. 2M is a schematic sectional view of a step subsequent to that of FIG. 2L.
FIG. 2N is a schematic sectional view of a step subsequent to that of FIG. 2M.
Figure 2:
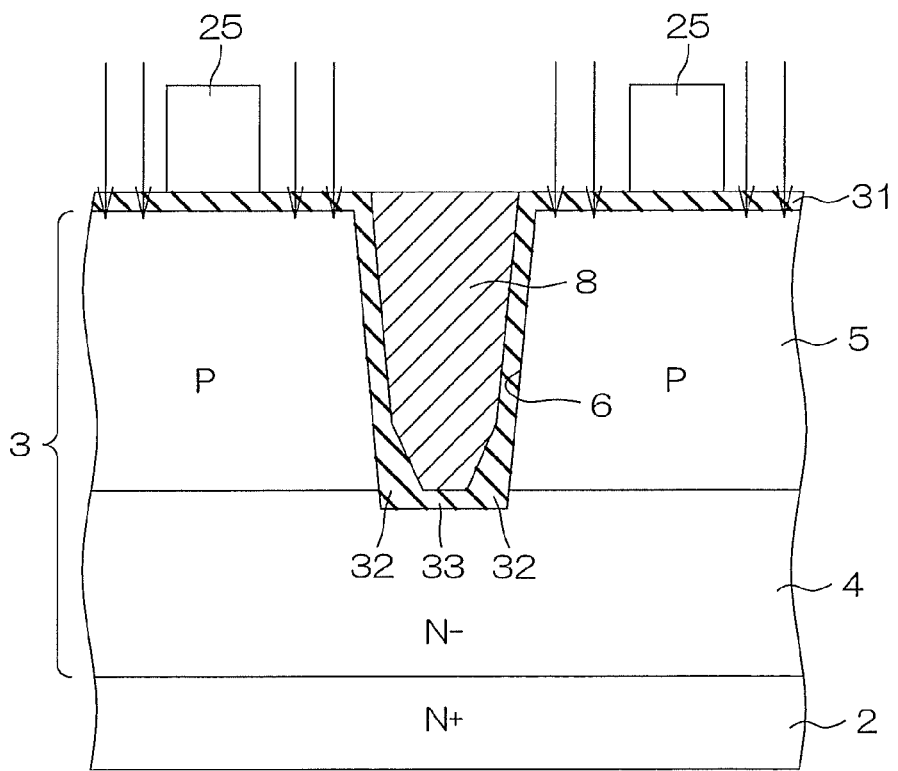
Figure 2K:
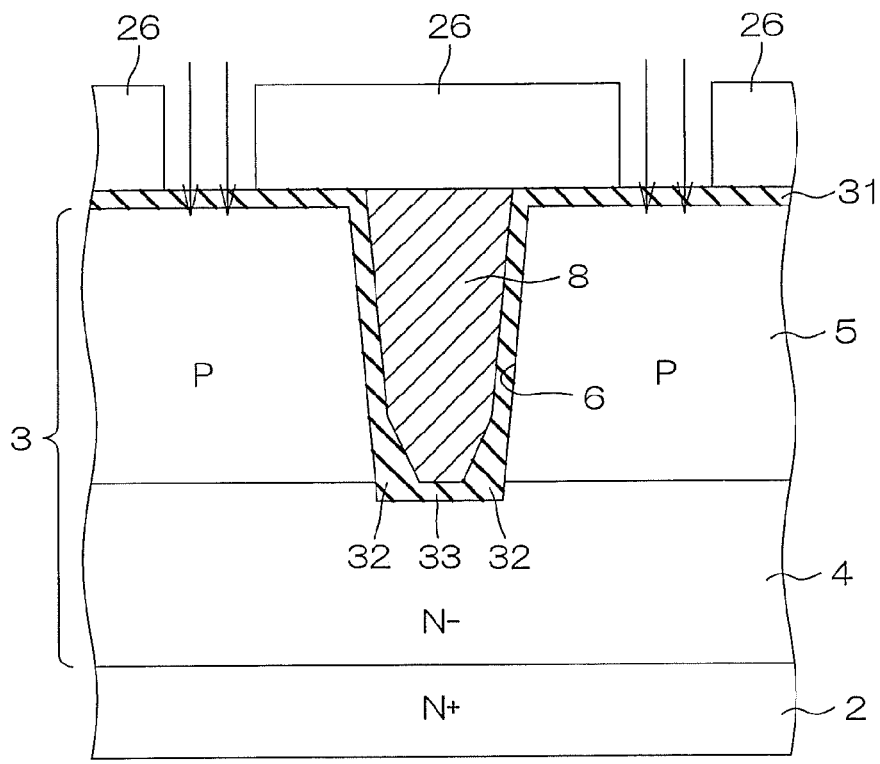
Figure 2L:
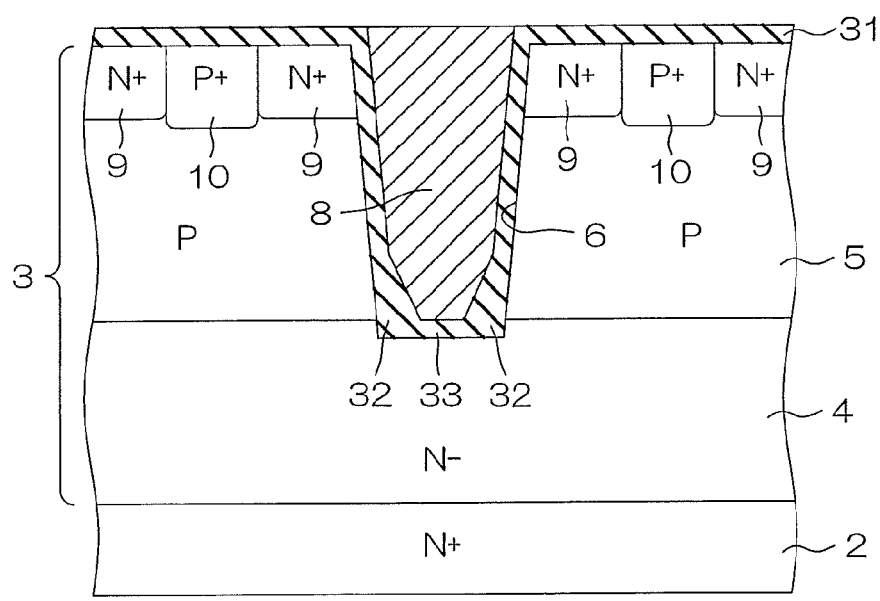
Figure 2M:
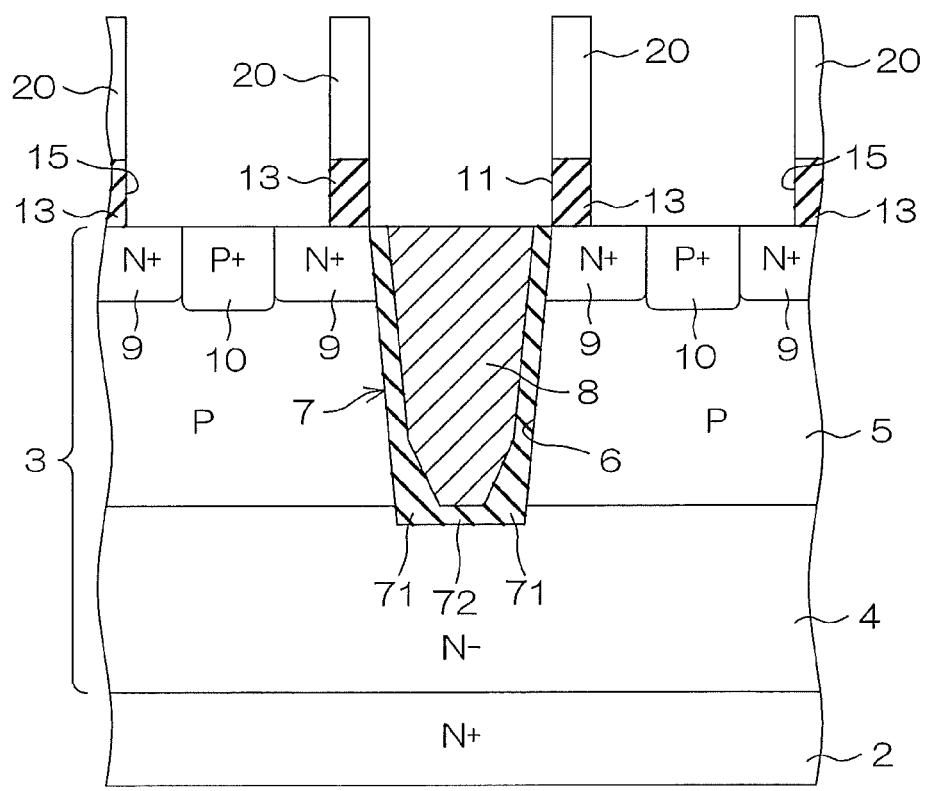
Figure 2N:
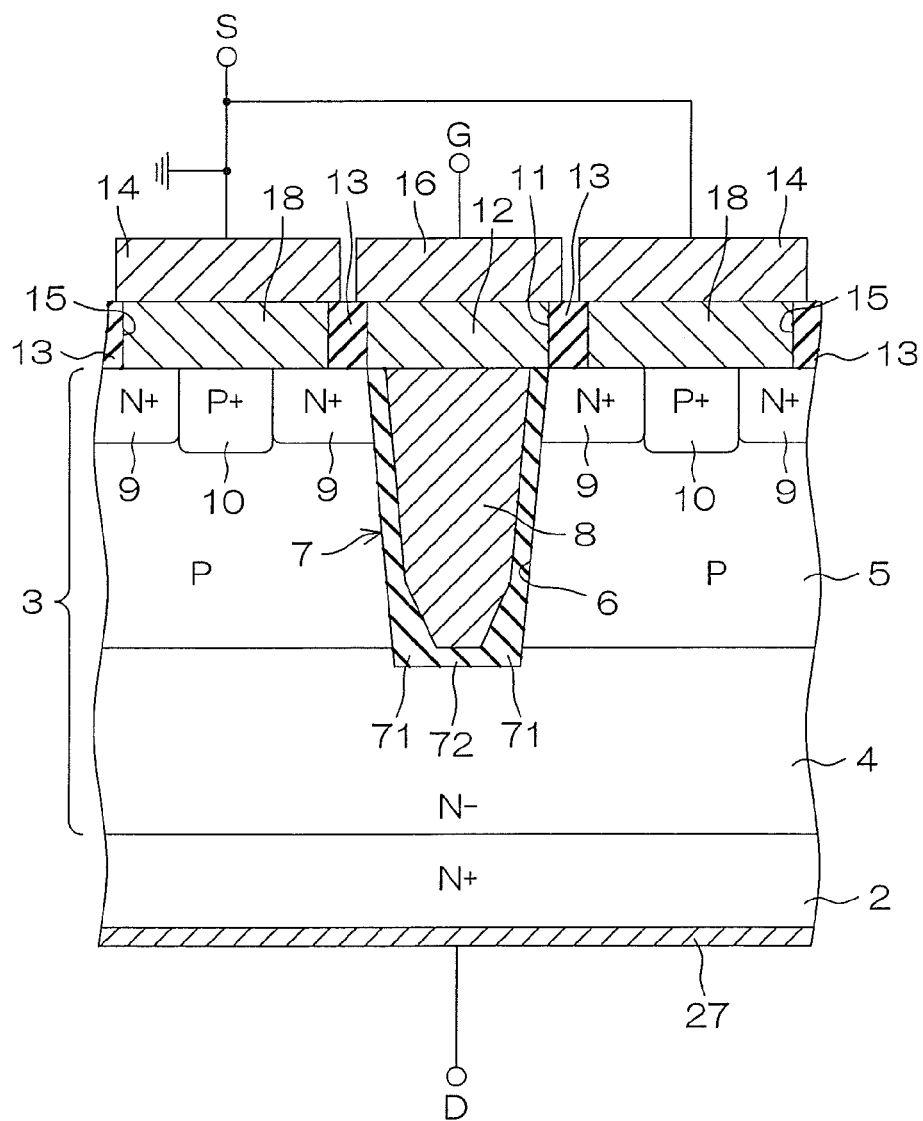

FIGS. 2A to 2N are schematic sectional views for describing a method of manufacturing the semiconductor device shown in FIG. 1.

First, the epitaxial layer 3 is formed on the N⁺-type substrate 2 by epitaxy, as shown in FIG. 2A.

Then, a sacrificial oxide film 21 made of $SiO_2$ is formed on the surface of the epitaxial layer 3 by thermal oxidation, as shown in FIG. 2B. Thereafter an SiN (silicon nitride) layer is formed on the sacrificial oxide film 21 by P-CVD (Plasma Chemical Vapor Deposition) and patterned, to form a hard mask 22 having an opening in a portion opposed to the portion for forming the trench 6. The sacrificial layer 21 and the epitaxial layer 3 are etched through the hard mask 22, thereby forming the trench 6 (step of forming a trench). After the formation of the trench 6, the sacrificial oxide film 21 and the hard mask 22 are removed.

Then, an oxide film 23 made of $SiO_2$ is formed on the overall region of the surface of the epitaxial layer 3 including the inner surface of the trench 6 by thermal oxidation, as shown in FIG. 2C.

After the formation of the oxide film 23, a deposition layer 24 of polysilicon doped with an N-type impurity in a high concentration is formed on the oxide film 23 by CVD, as shown in FIG. 2D (step of forming an oxide film material deposition layer). The deposition layer 24 is formed in a thickness not completely filling up the trench 6.

Then, the deposition layer 24 is etched back, as shown in FIG. 2E. Due to this etch-back, the deposition layer 24 partially remains on the peripheral edge portion of the bottom surface of the trench 6 as a deposit section 30 (step of partially leaving the oxide film material deposition layer).

Then, the oxide film 23 is removed by etching, to leave portions sandwiched between the deposit section 30 and the inner surface of the trench 6, as shown in FIG. 2F. Thus, the central portion of the bottom surface and the side surface of the trench 6 are exposed.

Then, the surface of the epitaxial layer 3 and the deposit section 30 are oxidized by thermal oxidation to form an oxide film 31, as shown in FIG. 2G. The deposit section 30 made of polysilicon doped with the N-type impurity in a high concentration is oxidized at a rate of oxidation of three times, for example, as compared with the epitaxial layer 3 made of Si. Therefore, the surface of the epitaxial layer 3 and the deposit section 30 are so simultaneously oxidized that a thick-film portion 32 having a relatively large thickness in the depth direction of the trench 6 is formed on the peripheral edge portion of the bottom surface of the trench 6 while a thin-film portion 33 having a relatively small thickness is formed on the central portion surrounded by this peripheral edge portion.

Then, a deposition layer of polysilicon doped with an N-type impurity in a high concentration is formed on the oxide film 31 by CVD. The trench 6 is filled up with the deposition layer of polysilicon. Then, a portion of the deposition layer of polysilicon located outside the trench 6 is removed by etching. Thus, the gate electrode 8 embedded in the trench 6 is obtained, as shown in FIG. 2H (step of forming a gate electrode).

Thereafter ions of a p-type impurity are implanted into the epitaxial layer 3 from the surface of the oxide film 31. Then, drive-in diffusion is performed. The ions of the P-type impurity implanted into the epitaxial layer 3 are diffused due to this drive-in diffusion, to form the body region 5 in the epitaxial layer 3, as shown in FIG. 2I (step of forming a body region). The remaining portion of the epitaxial layer 3 other than the body region 5 forms the $N^-$-type region 4 in the state after the epitaxy.

After the drive-in diffusion, a mask 25 having openings in portions opposed to the portions for forming the source regions 9 is formed on the oxide film 31, as shown in FIG. 2J. Then, ions of an N-type impurity are implanted into the surface layer portion of the epitaxial layer 3 through the openings of the mask 25. After this ion implantation, the mask 25 is removed.

Further, another mask 26 having openings in portions opposed to the portions for forming the contact regions 10 is formed on the oxide film 31, as shown in FIG. 2K. Then, ions of a P-type impurity are implanted into the surface layer portion of the epitaxial layer 3 through the openings of the mask 26. After this ion implantation, the mask 26 is removed.

Thereafter annealing is performed. The ions of the N-type and P-type impurities implanted into the surface layer portion of the epitaxial layer 3 are activated due to this annealing, to form the source regions 9 and the contact regions 10 on the surface layer portion of the epitaxial layer 3, as shown in FIG. 2L (step of forming a source region).

After the aforementioned steps, a portion of the oxide film 31 located outside the trench 6 is removed to leave the oxide film 31 only on the inner surface of the trench 6, thereby obtaining the gate insulating film 7. The thick-film portion 32 and the thin-film portion 33 of the oxide film 31 form the thick-film portion 71 and the thin-film portion 72 of the gate insulating film 7 respectively.

Thereafter $SiO_2$ is deposited on the epitaxial layer 3 by CVD. Then, a mask 20 having openings in portions opposed to the portions for forming the contact holes 11 and 15 respectively is formed on the deposited $SiO_2$, and $SiO_2$ is dry-etched through this mask 20. Thus, the interlayer dielectric film 13 having the contact holes 11 and 15 is formed, as shown in FIG. 2M.

Then, the gate plug 12, the gate wire 16, the source plugs 18, the source wires 14 and the drain electrode 27 are formed, as shown in FIG. 2N. Thus, the semiconductor device 1 shown in FIG. 1 is obtained.

According to this method, the deposition layer 24 is so etched back as to partially remain on the peripheral edge portion of the bottom surface of the trench 6 as the deposit section 30. The deposit section 30 is oxidized simultaneously with the surface of the epitaxial layer 3 by thermal oxidation. Thus, the deposit section 30 forms the thick-film portion 32 having the relatively large thickness. On the other hand, the portion resulting from the oxidation of the bottom surface of the trench 6 forms the thin-film portion 33 having the relatively small thickness. The thick-film portion 32 and the thin-film portion 33 form the thick-film portion 71 and the thin-film portion 72 of the gate insulating film 7 respectively.

Thus, the thick-film portion 71 and the thin-film portion 72 of the gate insulating film 7 can be formed at the same time. That is, the gate insulating film 7 including the thick-film portion 71 and the thin-film portion 72 can be easily formed without through complicated steps.

Figure 3:
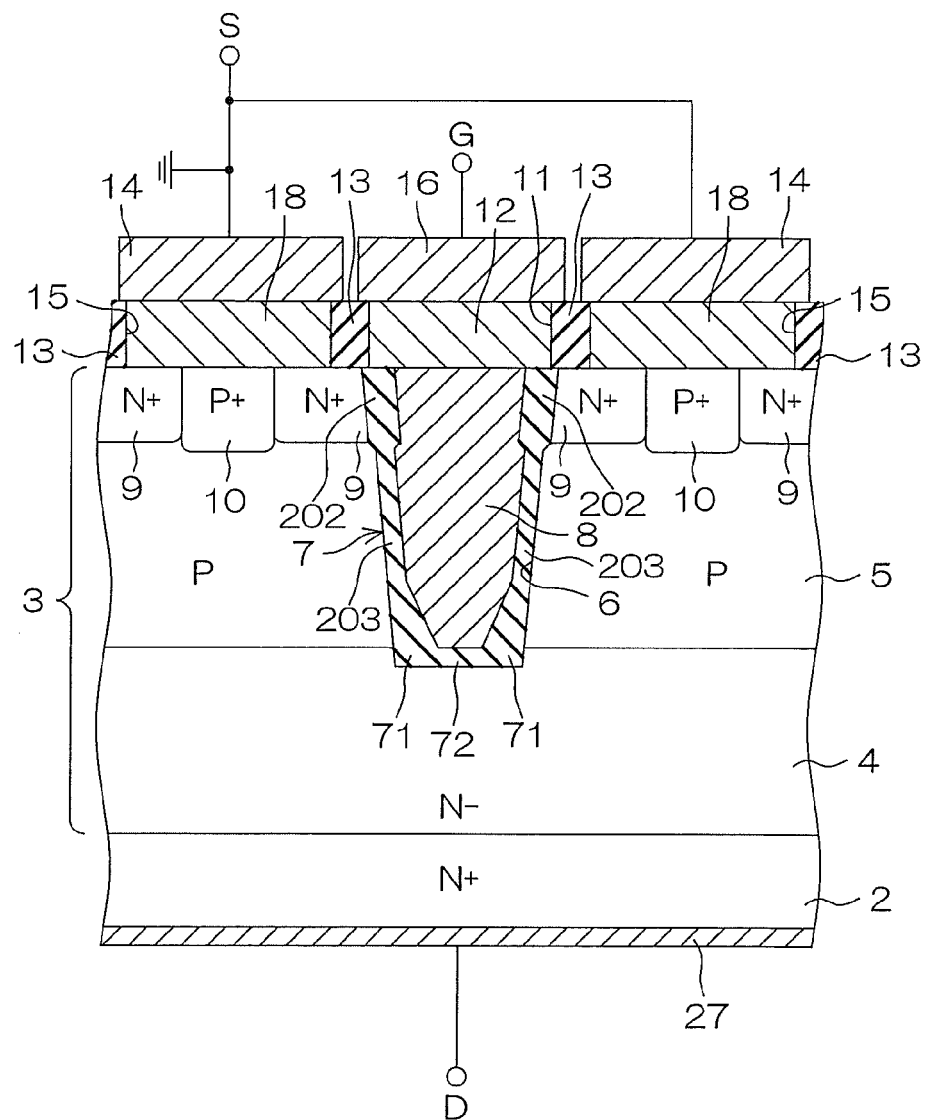
FIG. 3 is a schematic sectional view of a semiconductor device according to a second embodiment of the present invention.

FIG. 3 is a schematic sectional view of a semiconductor device according to a second embodiment of the present invention.

Referring to FIG. 3, portions corresponding to those shown in FIG. 1 are denoted by the same reference numerals. In the following, only points different from those of the structure shown in FIG. 1 are described, and redundant description is omitted as to the portions having the same reference numerals.

In the semiconductor device 201 shown in FIG. 3, a gate insulating film 7 is so formed that the thickness of a portion 202 in contact with each source region 9 is larger than the thickness of a portion 203 in contact with a body region 5 on the side surface of a trench 6. More specifically, the thickness of the portion 202 of the gate insulating film 7 in contact with the source region 9 is increased while the thickness of the portion 203 of the gate insulating film 7 in contact with the body region 5 is properly set in consideration of the gate threshold voltage and the channel resistance. As illustrated in FIG. 3, the width of the gate electrode 8 at at least a portion thereof opposing the source region 9 is smaller than the width of the gate electrode 8 at a portion not opposing the source region 9, the widths being measured in a direction in which the portion of the gate electrode 8 opposes the source region 9. Thus, the capacitance between a gate electrode 8 and the source region 9, i.e., the gate-to-source capacitance $C_{gs}$ can be reduced without increasing the on-resistance $R_{on}$, and the gate charge quantity $Q_g$ can also be reduced. Consequently, the speed of a switching operation of a transistor can be further increased.

Further, the thickness of the portion 202 of the gate insulating film 7 in contact with the source region 9 is so increased that a large interval can be ensured between the gate electrode 8 and the source region 9. Consequently, the gate-to-source withstand voltage can be improved.

FIGS. 4A to 4G are schematic sectional views for describing a method of manufacturing the semiconductor device shown in FIG. 3.

The semiconductor device 201 shown in FIG. 3 is obtained by carrying out the steps shown in FIGS. 2A to 2G and thereafter carrying out the steps shown in FIGS. 4A to 4G in place of the steps shown in FIGS. 2H to 2M. Referring to FIGS. 4A to 4G, portions corresponding to those shown in FIGS. 2I to 2M are denoted by the same reference numerals.

Figure 4A:
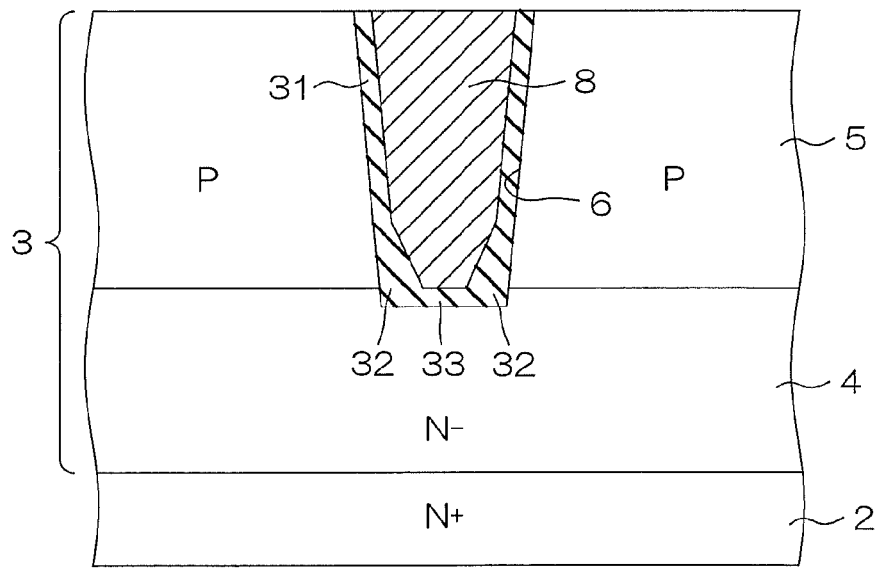
FIG. 4A is a schematic sectional view successively showing the step of manufacturing the semiconductor device shown in FIG. 3.

After the step shown in FIG. 2G, a deposition layer of polysilicon doped with an N-type impurity in a high concentration is formed on an oxide film 31 by CVD. The trench 6 is filled up with the deposition layer of polysilicon. Then, portions of the deposition layer of polysilicon and the oxide film 31 located outside the trench 6 are removed by etching. Thus, the gate electrode 8 embedded in the trench 6 is obtained, as shown in FIG. 4A.

Thereafter ions of a P-type impurity are implanted into an epitaxial layer 3 from the surface of the oxide film 31. Then, drive-in diffusion is performed. The ions of the P-type impurity implanted into the epitaxial layer 3 are diffused due to this drive-in diffusion, thereby forming the body region 5 in the epitaxial layer 3. Further, the remaining portion of the epitaxial layer 3 other than the body region 5 forms an N⁻-type region 4 in a state after epitaxy.

Figure 4B:
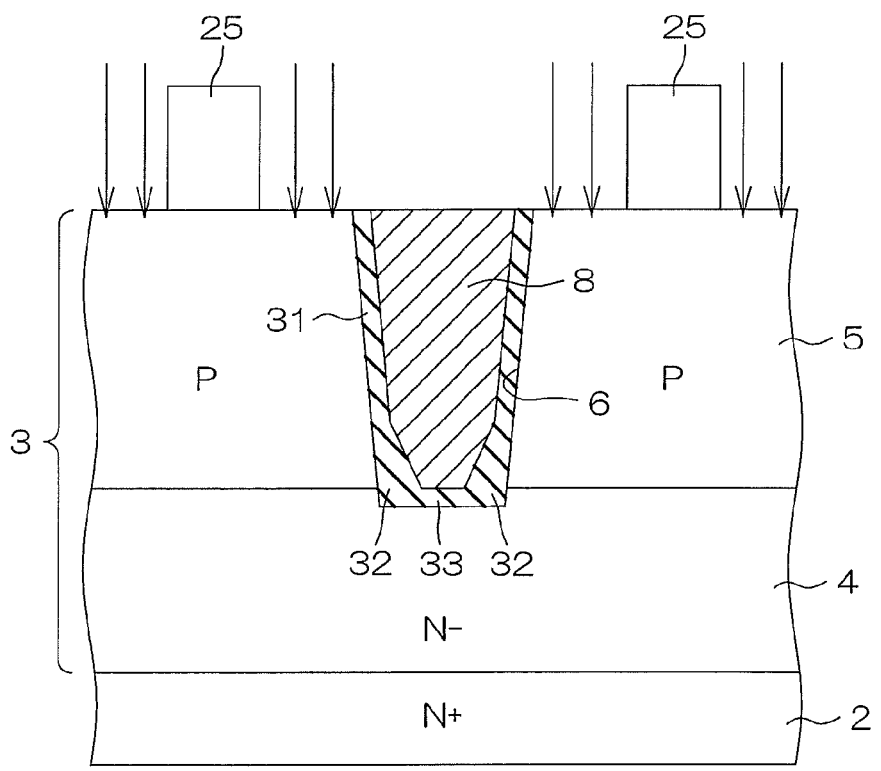
FIG. 4B is a schematic sectional view of a step subsequent to that of FIG. 4A.

After the drive-in diffusion, a mask 25 having an opening in a portion opposed to a portion for forming the source region 9 is formed on the oxide film 31, as shown in FIG. 4B. Then, ions of an N-type impurity are implanted into the surface layer portion of the epitaxial layer 3 through the opening of the mask 25. After this ion implantation, the mask 25 is removed.

Figure 4C:
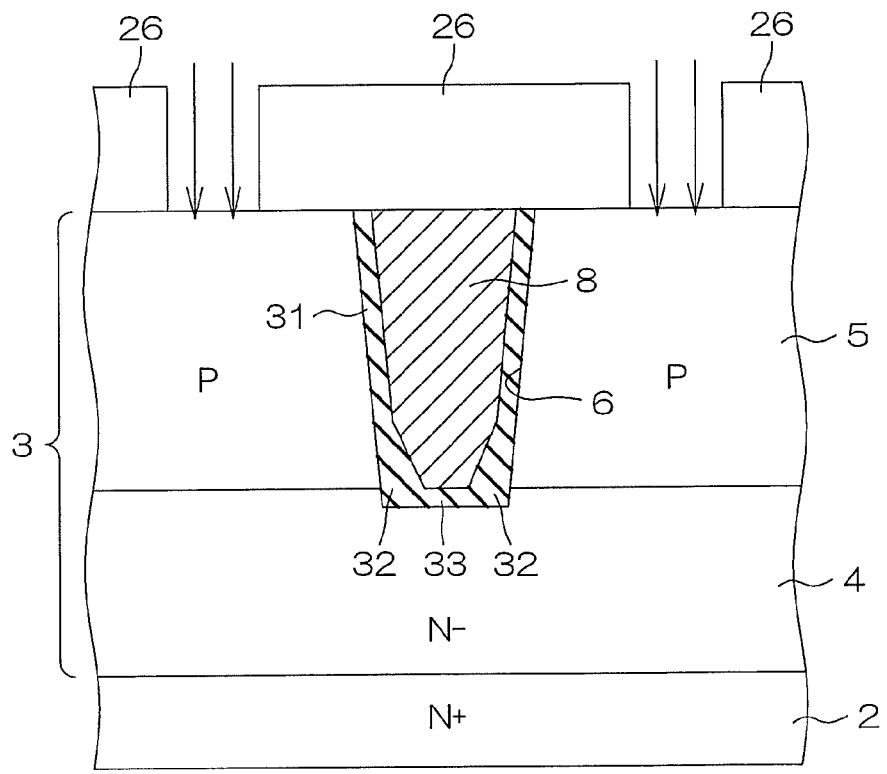
FIG. 4C is a schematic sectional view of a step subsequent to that of FIG. 4B.

Further, another mask 26 having an opening in a portion opposed to a portion for forming each contact region 10 is formed on the oxide film 31, as shown in FIG. 4C. Then, ions of a P-type impurity are implanted into the surface layer portion of the epitaxial layer 3 through the opening of the mask 26. After this ion implantation, the mask 26 is removed.

Figure 4D:
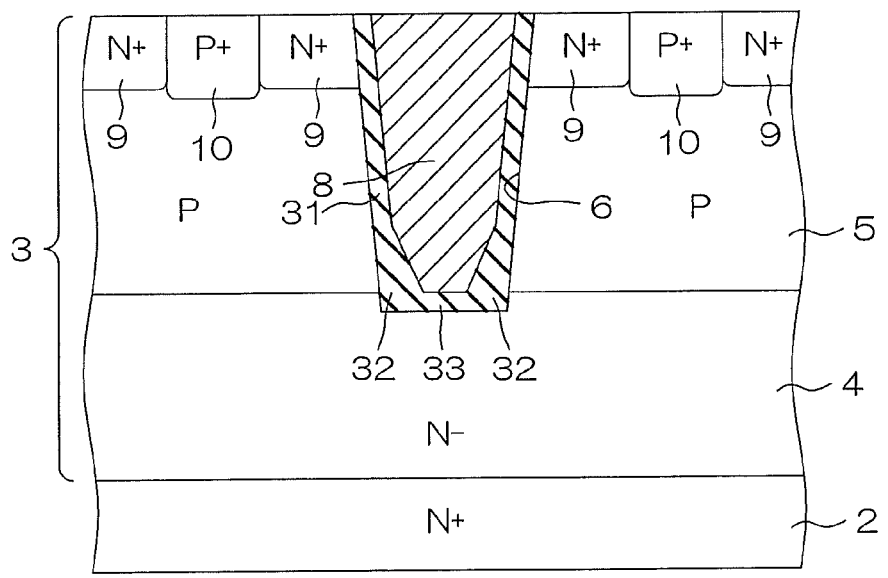
FIG. 4D is a schematic sectional view of a step subsequent to that of FIG. 4C.
Figure 4:
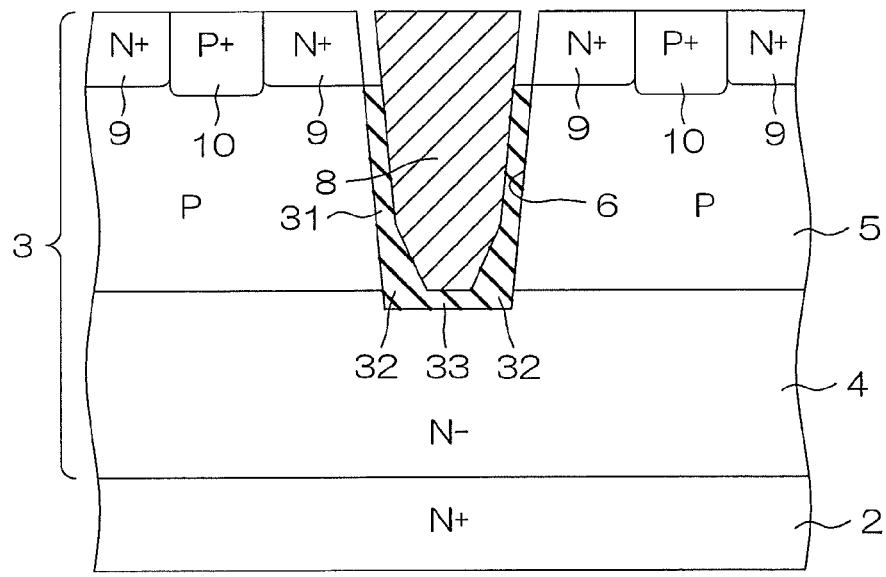
FIG. 4E is a schematic sectional view of a step subsequent to that of FIG. 4D.
FIG. 4F is a schematic sectional view of a step subsequent to that of FIG. 4E.
FIG. 4G is a schematic sectional view of a step subsequent to that of FIG. 4F.
Figure 4:
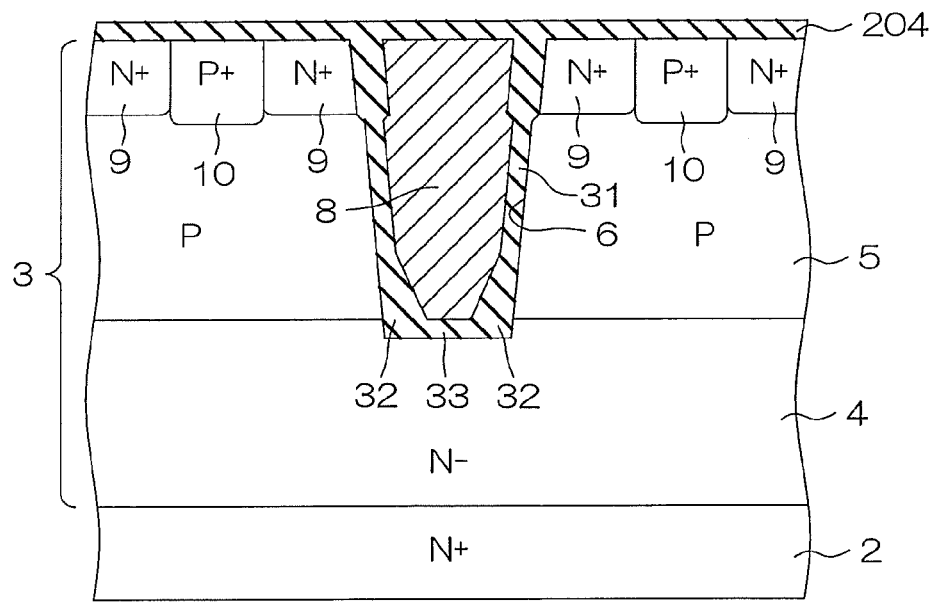

Thereafter annealing is performed. The ions of the N-type and P-type impurities implanted into the surface layer portion of the epitaxial layer 3 are activated due to this annealing, to form the source region 9 and the contact region 10 on the surface layer portion of the epitaxial layer 3, as shown in FIG. 4D.

Then, HF (hydrofluoric acid) is supplied to the surface of the epitaxial layer 3. A portion of the oxide film 31 in contact with the source region 9 is removed due to the action of HF, as shown in FIG. 4E.

Thereafter an oxide film 204 is formed on the surfaces of the epitaxial layer 3 and the gate electrode 8 and between the source region 9 and the gate electrode 8 by thermal oxidation, as shown in FIG. 4F. The portion into which the N-type impurity is implanted in a high concentration has a high rate for growing an oxide film by thermal oxidation, and hence the oxide film 204 is grown into a larger thickness than the oxide film 31 in a short time.

Figure 4G:
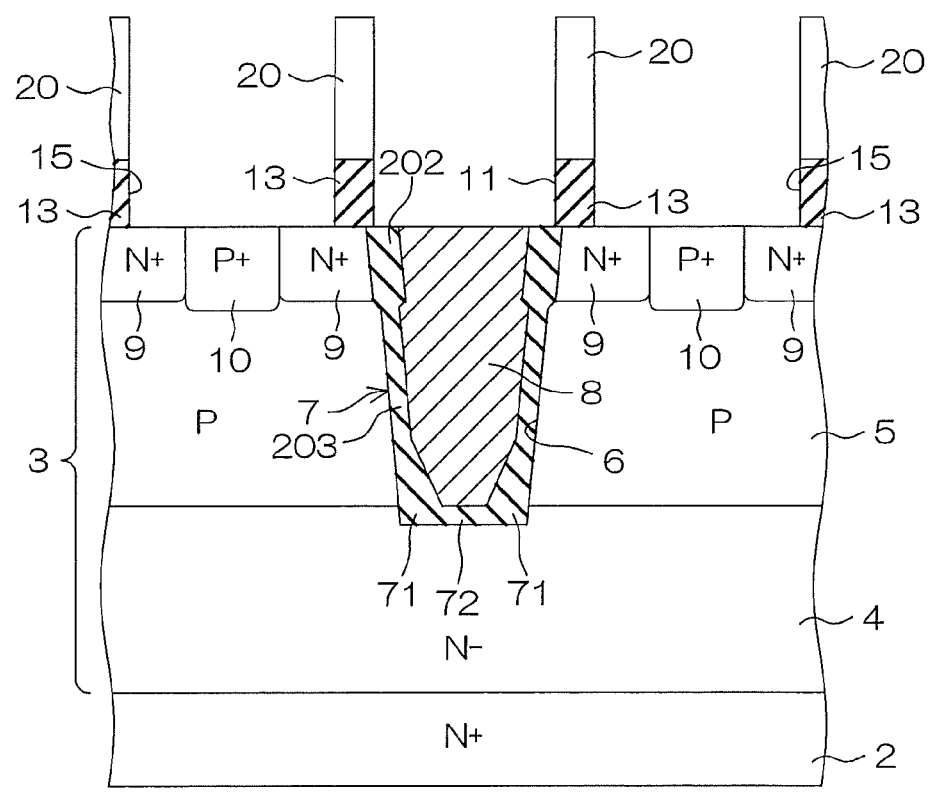

After the aforementioned steps, a portion of the oxide film 204 located outside the trench 6 is removed so that the oxide film 204 remains only in the trench 6, as shown in FIG. 4G. The remaining oxide film 204 constitutes the gate insulating film 7 along with the oxide film 31, and forms the portion 202 of the gate insulating film 7 in contact with the source region 9. Then, $SiO_2$ is deposited on the epitaxial layer 3 by CVD. Then, a mask 20 having openings in portions opposed to portions for forming contact holes 11 and 15 respectively is formed on the deposited $SiO_2$, and $SiO_2$ is dry-etched through this mask 20. Thus, an interlayer dielectric film 13 having the contact holes 11 and 15 is formed.

Then, a gate plug 12, a gate wire 16, source plugs 18, source wires 14 and a drain electrode 27 are formed. Thus, the semiconductor device 201 shown in FIG. 3 is obtained.

Figure 5:
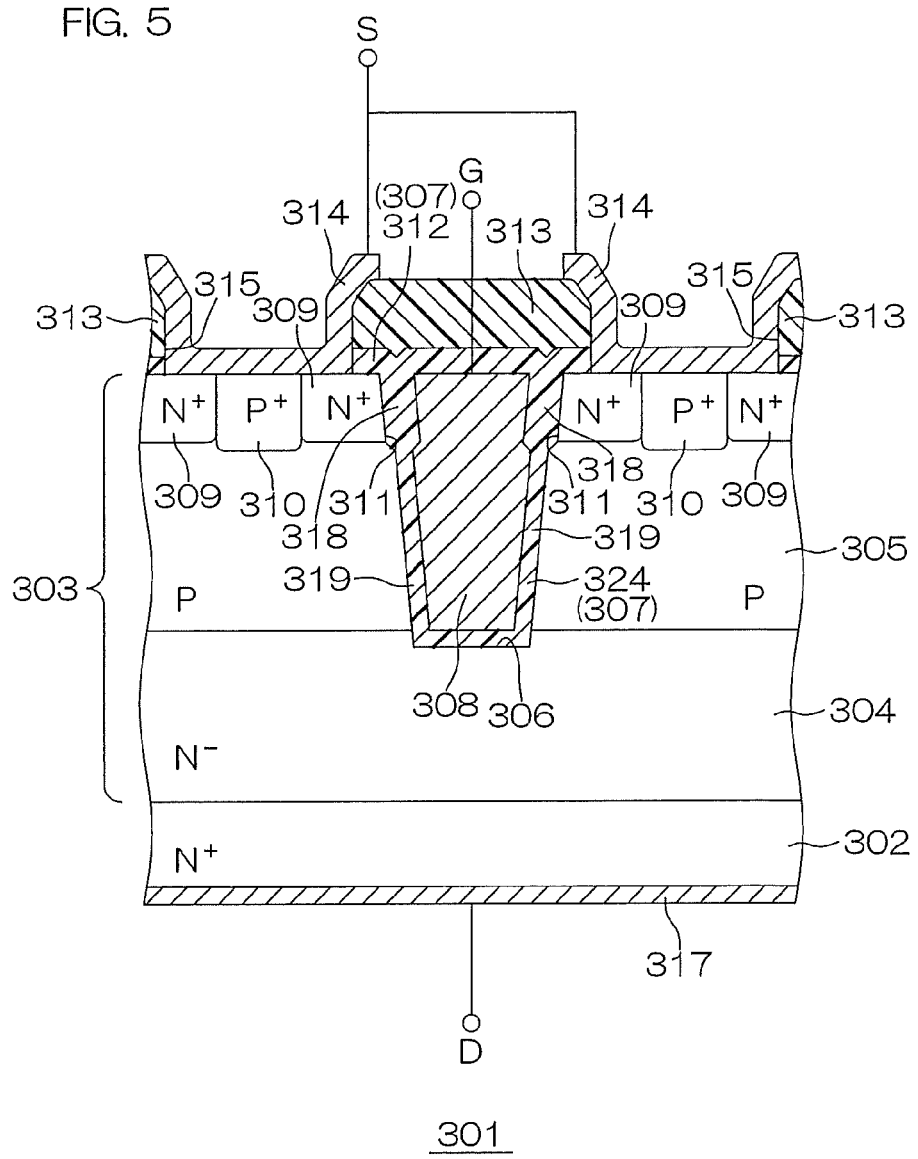
FIG. 5 is a schematic sectional view of a semiconductor device according to a third embodiment of the present invention.

FIG. 5 is a schematic sectional view of a semiconductor device according to a third embodiment of the present invention.

The semiconductor device 301 has an array structure formed by arranging unit cells having trench gate type VDMOSFETS in the form of a matrix.

On an N⁺-type substrate 302 forming the base of the semiconductor device 301, an N⁻-type epitaxial layer 303 made of silicon doped with an N-type impurity in a lower concentration ($10^{15}/cm^3$, for example) than the N⁺-type substrate 302 is laminated as a semiconductor layer. A base layer portion of the epitaxial layer 303 forms an N⁻-type region 304 as a first conductivity type region in a state after epitaxy. In the epitaxial layer 303, a P-type body region 305 is formed on the N⁻-type region 304, to be in contact with the N⁻-type region 304.

A trench 306 is dug in the epitaxial layer 303 from the surface thereof. The trench 306 penetrates through the body region 305, so that the deepest portion thereof reaches the N⁻-type region 304. A plurality of such trenches 306 are formed at regular intervals in a horizontal direction in FIG. 5, to extend in a direction (along the gate width) orthogonal to the plane of FIG. 5 respectively.

A gate electrode 308 made of polysilicon doped with an N-type impurity in a high concentration is embedded in the trench 306 through a gate insulating film 307. The gate insulating film 307 is so formed as to cover a bottom surface and a side surface of the trench 306, to extend from the side surface of the trench 306 onto a surface of the epitaxial layer 303, and to cover a surface of the gate electrode 308.

On the surface layer portion of the epitaxial layer 303, N⁺-type source regions 309 each having a higher N-type impurity concentration ($10^{19}/cm^3$, for example) than the N⁻-type region 304 are formed on both sides of the trench 306 in the direction (horizontal direction in FIG. 5) orthogonal to the gate width. Each source region 309 extends along the trench 306 in the direction along the gate width, so that a bottom portion thereof is in contact with the body region 305. A P⁺-type contact region 310 is formed at a center of the source region 309 in the direction orthogonal to the gate width, to penetrate through the source region 309.

That is, the trenches 306 and the source regions 309 are alternately provided in the direction orthogonal to the gate width, to extend in the direction along the gate width respectively. Boundaries between the unit cells adjacent to one another in the direction orthogonal to the gate width are set on the source regions 309, along the source regions 309. At least one or more contact regions 310 are provided over each pair of unit cells adjacent to each other in the direction orthogonal to the gate width. Boundaries between the unit cells adjacent to one another in the direction along the gate width are so set that the gate electrode 308 included in each unit cell has the constant gate width.

An interlayer dielectric film 313 is laminated on the epitaxial layer 303. Source wires 314 are formed on the interlayer dielectric film 313. The source wires 314 are grounded. The source wires 314 are in contact (electrically connected) with the source regions 309 and the contact regions 310 through contact holes 315 formed in the interlayer dielectric film 313.

A drain electrode 317 is formed on a back surface of the $N^+$-type substrate 302.

When a potential of the gate electrode 308 is controlled while applying a positive voltage of a proper level to the drain electrode 317, channels are formed in the vicinity of an interface between the body region 305 and the gate insulating film 307, and current flows between the source regions 309 and the drain electrode 317.

The gate insulating film 307 is so formed that a thickness of a portion 318 in contact with each source region 309 is larger than a thickness of a portion 319 in contact with the body region 305 on the side surface of the trench 306. More specifically, the thickness of the portion of the gate insulating film 307 in contact with the source region 309 is increased while the thickness of the portion 319 of the gate insulating film 307 in contact with the body region 305 is properly set in consideration of the gate threshold voltage and the channel resistance.

Thus, the capacitance between the gate electrode 308 and the source region 309, i.e., the gate-to-source capacitance $C_{gs}$ can be reduced without increasing the on-resistance $R_{on}$, and the gate charge quantity $Q_g$ can also be reduced. Consequently, the speed of a switching operation of a transistor can be further increased.

Further, the thickness of the portion 318 of the gate insulating film 307 in contact with the source region 309 is so increased that a large interval can be ensured between the gate electrode 308 and the source region 309. Consequently, the gate-to-source withstand voltage can be improved.

In addition, the gate insulating film 307 extends from the side surface of the trench 306 onto a surface of the source region 309. Thus, the gate insulating film 307 can be reliably interposed between the gate electrode 308 and the source region 309. Consequently, the gate-to-source withstand voltage can be reliably improved.

FIGS. 6A to 6L are schematic sectional views for describing a method of manufacturing the semiconductor device shown in FIG. 5.

Figure 6A:
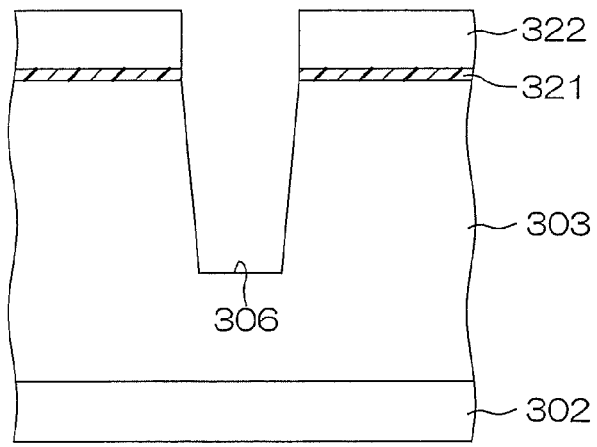
FIG. 6A is a schematic sectional view successively showing the step of manufacturing the semiconductor device shown in FIG. 5.

First, the epitaxial layer 303 is formed on the $N^+$-type substrate 302 by epitaxy, as shown in FIG. 6A. Then, a sacrificial oxide film 321 made of $SiO_2$ (silicon oxide) is formed on the surface of the epitaxial layer 303 by thermal oxidation. Thereafter an SiN (silicon nitride) layer is formed on the sacrificial oxide film 321 by P-CVD (Plasma Chemical Vapor Deposition) or LP-CVD (Low Pressure Chemical Vapor Deposition) and patterned, to form a hard mask 322 having an opening in a portion opposed to a portion for forming the trench 306. The sacrificial layer 321 and the epitaxial layer 303 are etched through the hard mask 322, thereby forming the trench 306.

Figure 6B:
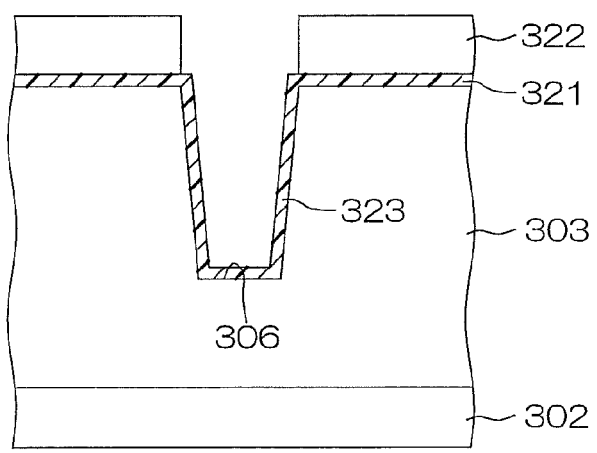
FIG. 6B is a schematic sectional view of a step subsequent to that of FIG. 6A.

Then, thermal oxidation is performed while leaving the hard mask 322 on the sacrificial oxide film 321, thereby forming another sacrificial oxide film 323 made of $SiO_2$ on the inner surface of the trench 306, as shown in FIG. 6B.

Figure 6C:
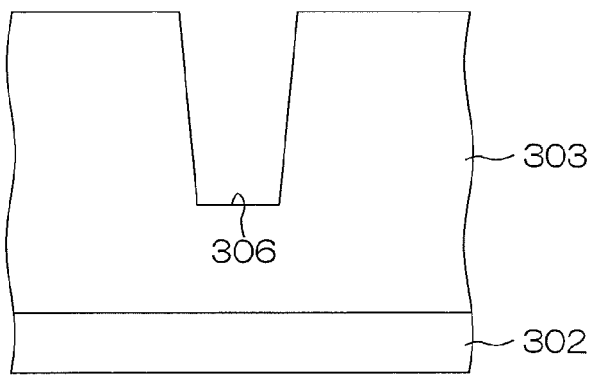
FIG. 6C is a schematic sectional view of a step subsequent to that of FIG. 6B.

Then, the hard mask 322 is removed, as shown in FIG. 6C. Further, the sacrificial oxide films 321 and 323 are removed. Thus, the surface of the epitaxial layer 303 is exposed.

Figure 6D:
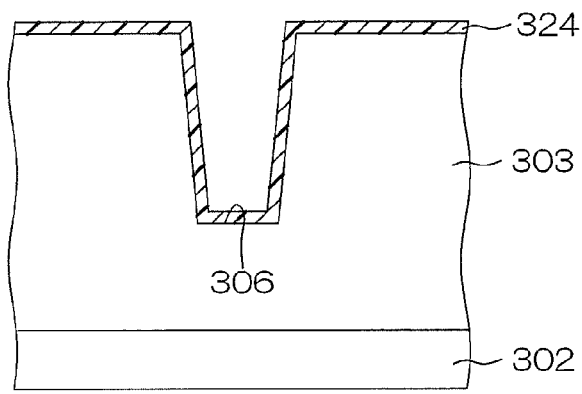
FIG. 6D is a schematic sectional view of a step subsequent to that of FIG. 6C.

Thereafter an oxide film 324 made of $SiO_2$ is formed on the overall region of the surface of the epitaxial layer 303 including the inner surface of the trench 306 by thermal oxidation, as shown in FIG. 6D.

Figure 6E:
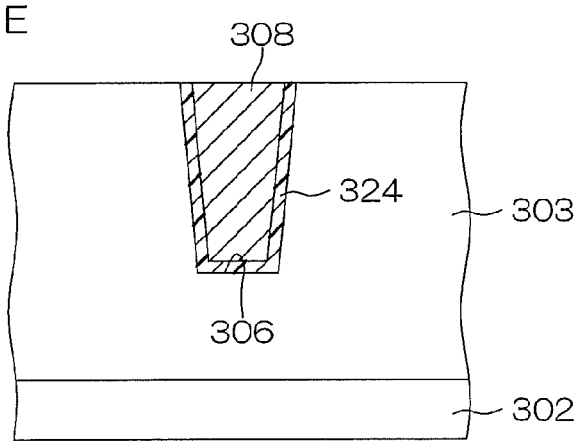
FIG. 6E is a schematic sectional view of a step subsequent to that of FIG. 6D.

Then, a deposition layer of polysilicon doped with an N-type impurity in a high concentration is formed on the oxide film 324 by CVD. The trench 306 is filled up with the deposition layer of polysilicon. Then, portions of the oxide film 324 and the deposition layer of polysilicon located outside the trench 306 are removed by etching. Thus, the gate electrode 308 embedded in the trench 306 is obtained, as shown in FIG. 6E.

Figure 6F:
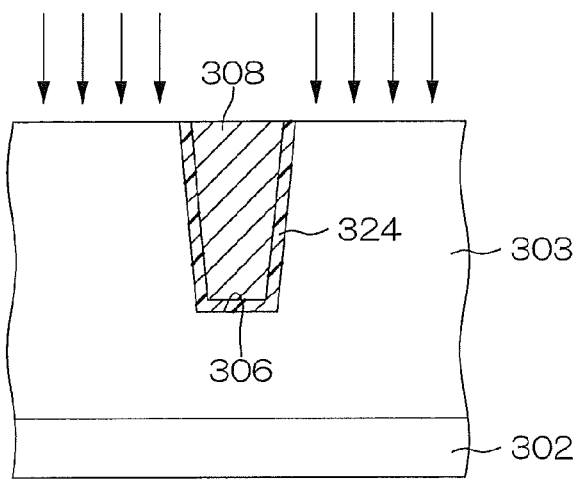
FIG. 6F is a schematic sectional view of a step subsequent to that of FIG. 6E.

Thereafter ions of a P-type impurity are implanted into the epitaxial layer 303 from the surface of the epitaxial layer 303, as shown in FIG. 6F.

Figure 6G:
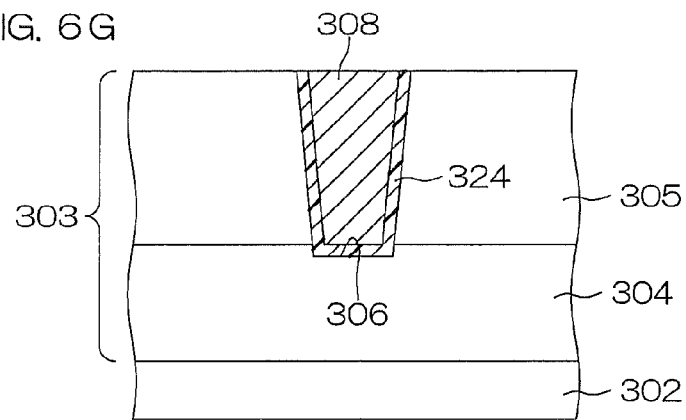
FIG. 6G is a schematic sectional view of a step subsequent to that of FIG. 6F.

Then, drive-in diffusion is performed. The body region 305 is formed in the epitaxial layer 303 due to this drive-in diffusion, as shown in FIG. 6G.

Figure 6H:
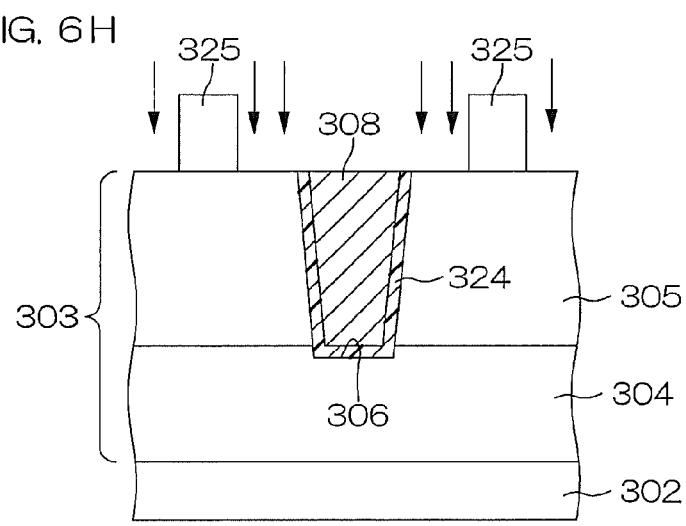
FIG. 6H is a schematic sectional view of a step subsequent to that of FIG. 6G.

After the drive-in diffusion, a mask 325 having a pattern covering portions for forming the contact regions 310 is formed on the epitaxial layer 303, as shown in FIG. 6H. Then, ions of an N-type impurity are implanted into the surface layer portion of the epitaxial layer 303 through openings of the mask 325. After this ion implantation, the mask 325 is removed.

Figure 6I:
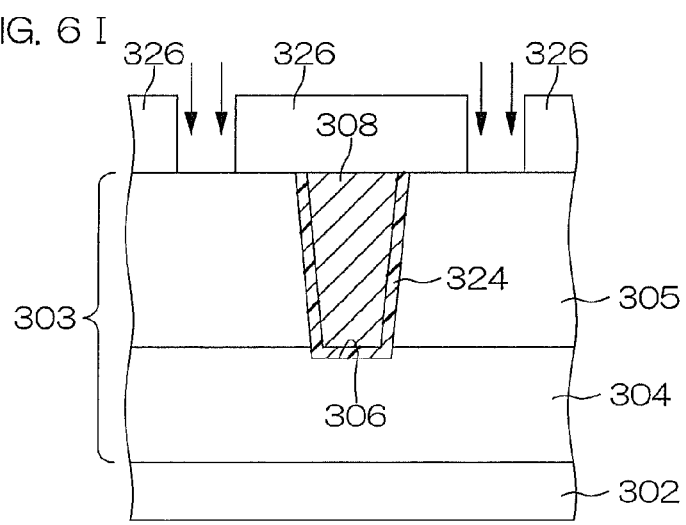
FIG. 6I is a schematic sectional view of a step subsequent to that of FIG. 6H.

Further, another mask 326 having openings in portions opposed to the portions for forming contact regions 310 is formed on the oxide film 324, as shown in FIG. 6I. Then, ions of a P-type impurity are implanted into the surface layer portion of the epitaxial layer 303 through the openings of the mask 326. After this ion implantation, the mask 326 is removed.

Figure 6J:
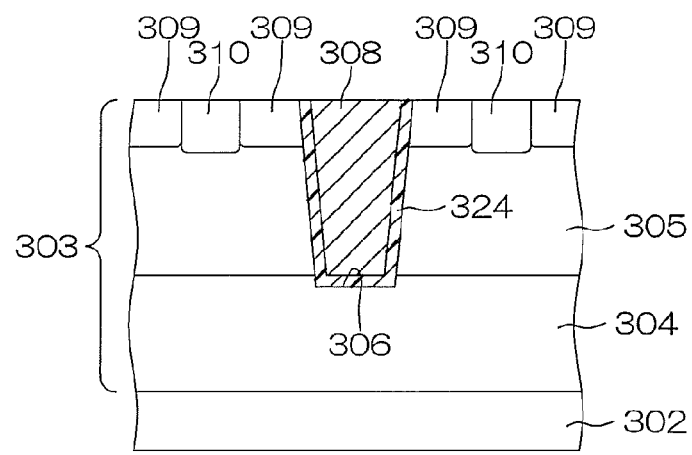
FIG. 6J is a schematic sectional view of a step subsequent to that of FIG. 6I.

Thereafter annealing is performed. The ions of the N-type and P-type impurities implanted into the surface layer portion of the epitaxial layer 303 are activated due to this annealing, to form the source regions 309 and the contact regions 310 on the surface layer portion of the epitaxial layer 303, as shown in FIG. 6J.

Figure 6K:
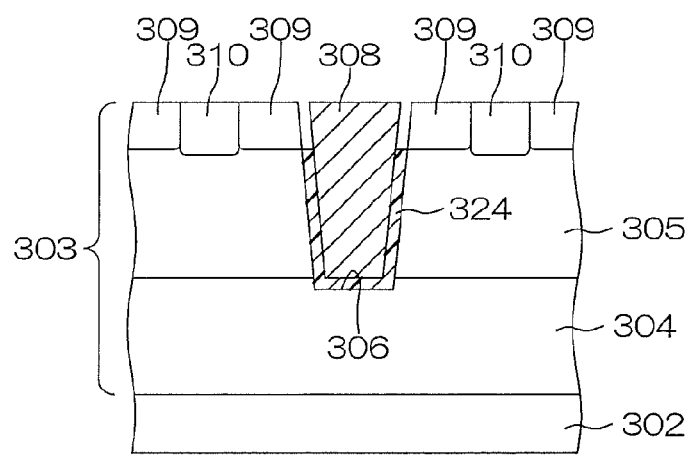
FIG. 6K is a schematic sectional view of a step subsequent to that of FIG. 6J.

Then, HF (hydrofluoric acid) is supplied to the surface of the epitaxial layer 303. Portions of the oxide film 324 in contact with the source regions 309 are removed due to the action of HF, as shown in FIG. 6K.

Figure 6L:
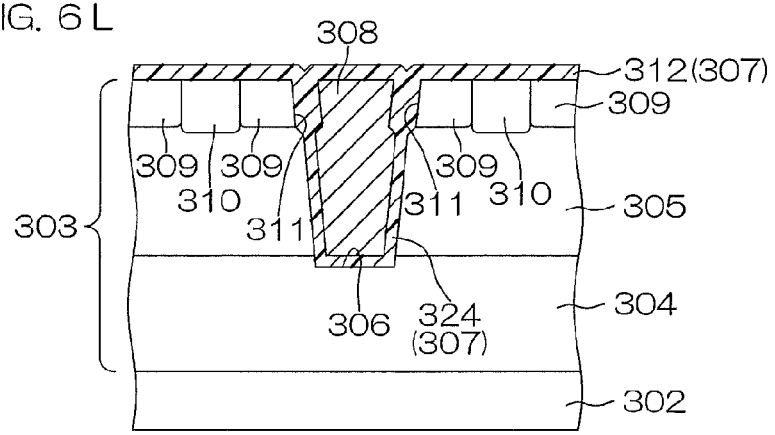
FIG. 6L is a schematic sectional view of a step subsequent to that of FIG. 6K.

Thereafter an oxide film 312 is formed on the surfaces of the epitaxial layer 303 and the gate electrode 308 and between the source regions 309 and the gate electrode 308 by thermal oxidation, as shown in FIG. 6L. The portion into which the N-type impurity is implanted in a high concentration has a high rate for growing an oxide film by thermal oxidation, and hence the oxide film 312 is grown into a larger thickness than the oxide film 324 in a short time. This oxide film 312 is integrated with the oxide film 324, to constitute the gate insulating film 307 along with the oxide film 324.

After the aforementioned steps, the interlayer dielectric film 313 is laminated on the epitaxial layer 303 by CVD. Then, the contact holes 315 etc. are formed in the interlayer dielectric film 313 by etching. Thereafter the source wires 314, a gate wire 16 and the drain electrode 317 are formed, whereby the semiconductor device 301 shown in FIG. 5 is obtained.

The gate insulating film 307 (oxide film 312) is formed after the formation of the source regions 309, whereby no N-type impurity is implanted into the gate insulating film 307. Therefore, the gate insulating film. 307 is not denatured by impurity implantation, and the dielectric voltage is not reduced due to denaturing of the gate insulating film 307.

The conductivity types of the semiconductor portions of the semiconductor devices 1, 201 and 301 may be reversed. In other words, the P-type portions may be converted to N-type portions and vice versa in the semiconductor devices 1, 201 and 301.

While the present invention has been described in detail by way of the embodiments thereof, it should be understood that these embodiments are merely illustrative of the technical principles of the present invention but not limitative of the invention. The spirit ad scope of the present invention are to be limited only by the appended claims.

What is claimed is:

1. A semiconductor device comprising:
    a semiconductor layer;
    a first conductivity type region of a first conductivity type formed on a base layer portion of the semiconductor layer;
    a body region of a second conductivity type formed on the semiconductor layer to be in contact with the first conductivity type region;
    a trench formed on the semiconductor layer to penetrate through the body region so that a deepest portion thereof reaches the first conductivity type region;
    a source region of the first conductivity type formed on a surface layer portion of the semiconductor layer around the trench to be in contact with the body region;
    a source wire formed on a surface of the source region;
    a gate insulating film formed on a bottom surface and a side surface of the trench; and
    a gate electrode embedded in the trench through the gate insulating film, the gate electrode having a top surface that is flush with the surface of the source region, wherein
    the gate insulating film includes a first portion being in contact with the source region within the trench and having a top surface that is flush with the surface of the source region, and a second portion being in contact with a region in the trench other than the source region, the first portion having a thickness larger than a thickness of the second portion,
    the gate electrode has a first portion in contact with the first portion of the gate insulating film, and a second portion in contact with the second portion of the gate insulating film, a surface of the first portion of the gate electrode and a surface of the second portion of the gate electrode being in parallel to each other, and being both sloped with respect to a surface of the semiconductor layer, and
    a width of the gate electrode at the first portion thereof is smaller than a width of the gate electrode at the second portion thereof, the widths being measured in a direction in which the first or second portion of the gate electrode opposes the source region.

2. The semiconductor device according to claim 1, wherein
    the first portion of the gate insulating film has a first surface in contact with the source region,
    the second portion of the gate insulating film has a second surface in contact with the body region, and
    a slope of the first surface is the same as a slope of the second surface.

3. The semiconductor device according to claim 2, wherein the first surface and the second surface of the gate insulating film are in parallel to each other, and are both sloped with respect to the surface of the semiconductor layer.

4. The semiconductor device according to claim 1, wherein the gate insulating film further includes a third portion having a thickness larger than the thickness of the second portion.

* * * * *